US012269982B2

United States Patent
Nienaber et al.

(10) Patent No.: US 12,269,982 B2
(45) Date of Patent: Apr. 8, 2025

(54) MAGNETICALLY ASSISTED DISPOSITION OF MAGNETIZABLE ABRASIVE PARTICLES

(71) Applicant: 3M INNOVATIVE PROPERTIES COMPANY, St. Paul, MN (US)

(72) Inventors: Aaron K. Nienaber, Maplewood, MN (US); Joseph B. Eckel, Vadnais Heights, MN (US); Thomas J. Nelson, Woodbury, MN (US); Brian D. Goers, Minneapolis, MN (US); Samad Javid, Woodbury, MN (US); Ronald D. Jesme, Plymouth, MN (US); Badri Veeraraghavan, Woodbury, MN (US); Sheryl A Vanasse, Spring Valley, WI (US)

(73) Assignee: 3M Innovative Properties Company, St. Paul, MN (US)

( * ) Notice: Subject to any disclaimer, the term of this patent is extended or adjusted under 35 U.S.C. 154(b) by 1164 days.

(21) Appl. No.: 16/479,738

(22) PCT Filed: Jan. 10, 2018

(86) PCT No.: PCT/US2018/013067
§ 371 (c)(1),
(2) Date: Jul. 22, 2019

(87) PCT Pub. No.: WO2018/136269
PCT Pub. Date: Jul. 26, 2018

(65) Prior Publication Data
US 2021/0332277 A1    Oct. 28, 2021

Related U.S. Application Data

(60) Provisional application No. 62/449,312, filed on Jan. 23, 2017.

(51) Int. Cl.
*C09K 3/14*    (2006.01)
*C23C 14/35*    (2006.01)
*C23C 26/00*    (2006.01)

(52) U.S. Cl.
CPC ............ *C09K 3/1409* (2013.01); *C23C 14/35* (2013.01); *C23C 26/00* (2013.01)

(58) Field of Classification Search
CPC ........ B24D 18/00; B24D 3/20; C09K 3/1409; C23C 14/35; C23C 26/00
See application file for complete search history.

(56) References Cited

U.S. PATENT DOCUMENTS 1,930,788 A    10/1933  Buckner
2,370,636 A    3/1945   Carlton
(Continued)

FOREIGN PATENT DOCUMENTS

CN    1830626      9/2006
CN    101353566    6/2011
(Continued)

OTHER PUBLICATIONS

Barbee, "Microstructure of Amorphous 304 Stainless Steel-Carbon Alloys Synthesized by Magnetron Sputter Deposition," Thin Solid Films, 1979, vol. 63, pp. 143-150.
(Continued)

*Primary Examiner* — Shuangyi Abu Ali

(57) ABSTRACT

According to one embodiment, a method can comprise: providing a tool that has a first portion that comprises a first material and a second portion that comprises a second material, wherein the second material differs from the first material and the tool is subject to a magnetic field, and wherein the first material and the second material are provided such that the magnetic field is relatively stronger at and adjacent the first portion relative to the magnetic field at
(Continued)

and adjacent the second portion; positioning a surface adjacent to the tool so as to be subject to the magnetic field; and disposing magnetizable abrasive particles on the surface, wherein the magnetizable abrasive particles are attracted to an area on the surface adjacent the first portion where the magnetic field is relatively stronger so as to provide for at least one of a desired orientation, placement and alignment of a majority of the magnetizable abrasive particles on the surface.

14 Claims, 22 Drawing Sheets

(56) References Cited

U.S. PATENT DOCUMENTS

| | | | |
|---|---|---|---|
| 2,857,879 A | 10/1958 | Johnson | |
| 2,947,616 A | 8/1960 | Coes, Jr. | |
| 2,958,593 A | 11/1960 | Hoover | |
| 3,246,430 A * | 4/1966 | Hurst | B24D 11/005 |
| | | | 51/293 |
| 3,306,719 A | 2/1967 | Fringhian | |
| 3,495,960 A | 2/1970 | Schladitz | |
| 3,625,666 A | 12/1971 | James | |
| 3,918,217 A | 11/1975 | Oliver | |
| 4,008,055 A | 2/1977 | Phaal | |
| 4,018,575 A | 4/1977 | Davis | |
| 4,227,350 A | 10/1980 | Fitzer | |
| 4,246,004 A | 1/1981 | Busch | |
| 4,314,827 A | 2/1982 | Leitheiser | |
| 4,331,453 A | 5/1982 | Dau | |
| 4,609,380 A | 9/1986 | Barnett | |
| 4,612,242 A | 9/1986 | Vesley | |
| 4,623,364 A | 11/1986 | Cottringer | |
| 4,652,275 A | 5/1987 | Bloecher | |
| 4,734,104 A | 3/1988 | Broberg | |
| 4,744,802 A | 5/1988 | Schwabel | |
| 4,751,137 A | 6/1988 | Haelg | |
| 4,770,671 A | 9/1988 | Monroe | |
| 4,881,951 A | 11/1989 | Monroe | |
| 4,916,869 A | 4/1990 | Oliver | |
| 4,991,362 A | 2/1991 | Heyer | |
| 5,009,675 A | 4/1991 | Kunz | |
| 5,137,542 A | 8/1992 | Buchanan | |
| 5,152,917 A | 10/1992 | Pieper | |
| 5,181,939 A | 1/1993 | Neff | |
| 5,201,916 A | 4/1993 | Berg | |
| 5,250,084 A | 10/1993 | Lansell | |
| 5,366,523 A | 11/1994 | Rowenhorst | |
| 5,380,390 A | 1/1995 | Tselesin | |
| 5,417,726 A | 5/1995 | Stout | |
| 5,500,273 A | 3/1996 | Holmes | |
| 5,554,068 A | 9/1996 | Carr | |
| 5,573,619 A | 11/1996 | Benedict | |
| 5,591,239 A | 1/1997 | Larson | |
| RE35,570 E | 7/1997 | Rowenhorst | |
| 5,681,361 A | 10/1997 | Sanders, Jr. | |
| 5,712,210 A | 1/1998 | Windisch | |
| 5,817,204 A | 10/1998 | Tselesin | |
| 5,858,140 A | 1/1999 | Berger | |
| 5,891,204 A * | 4/1999 | Neff | B24D 3/08 |
| | | | 51/297 |
| 5,928,070 A | 7/1999 | Lux | |
| 5,942,015 A | 8/1999 | Culler | |
| 5,984,988 A | 11/1999 | Berg | |
| 6,017,831 A | 1/2000 | Beardsley | |
| 6,083,631 A | 7/2000 | Neff | |
| 6,120,568 A | 9/2000 | Neff | |
| 6,207,246 B1 | 3/2001 | Moren | |
| 6,261,682 B1 | 7/2001 | Law | |
| 6,302,930 B1 | 10/2001 | Lux | |
| 7,727,931 B2 | 6/2010 | Brey | |
| 8,034,137 B2 | 10/2011 | Erickson | |
| 8,142,531 B2 | 3/2012 | Adefris | |
| 8,262,758 B2 | 9/2012 | Gao | |
| 8,698,394 B2 | 4/2014 | McCutcheon | |
| 2005/0218566 A1 | 10/2005 | Suzuki | |
| 2008/0131705 A1 | 6/2008 | Colburn | |
| 2008/0289262 A1 | 11/2008 | Gao | |
| 2011/0088330 A1 | 4/2011 | Beekam | |
| 2013/0203328 A1 | 8/2013 | Givot | |
| 2013/0244552 A1 | 9/2013 | Lee | |
| 2013/0252521 A1 | 9/2013 | Kasashima | |
| 2013/0252522 A1 | 9/2013 | Kasashima | |
| 2013/0344786 A1 | 12/2013 | Keipert | |
| 2014/0106126 A1 | 4/2014 | Gaeta | |
| 2014/0256238 A1 * | 9/2014 | Van | B24D 7/14 |
| | | | 451/548 |
| 2014/0290147 A1 | 10/2014 | Seth | |
| 2014/0291895 A1 | 10/2014 | Kanade | |
| 2015/0210910 A1 * | 7/2015 | Hejtmann | C04B 35/1115 |
| | | | 51/309 |
| 2016/0221153 A1 | 8/2016 | Rizzo, Jr. | |

FOREIGN PATENT DOCUMENTS

| | | | |
|---|---|---|---|
| CN | 103590090 | 2/2014 | |
| CN | 104191385 | 12/2014 | |
| CN | 104999385 | 10/2015 | |
| DE | 3042643 | 7/1981 | |
| DE | 102012221316 | 5/2014 | |
| DE | 202014101741 | 6/2014 | |
| DE | 102013212609 | 12/2014 | |
| DE | 102013212617 | 12/2014 | |
| DE | 102013212639 | 12/2014 | |
| DE | 102013212666 | 12/2014 | |
| DE | 102013212670 | 12/2014 | |
| DE | 102013212670 A1 * | 12/2014 | B24D 11/001 |
| DE | 102013212684 | 12/2014 | |
| EP | 1122718 | 8/2001 | |
| GB | 396231 | 8/1933 | |
| GB | 1477767 | 6/1977 | |
| JP | S63-232947 | 9/1988 | |
| JP | H07-078509 | 3/1995 | |
| JP | H07-266236 | 10/1995 | |
| JP | H11-165252 | 6/1999 | |
| JP | 2002-053367 | 2/2002 | |
| JP | 2004-098265 | 4/2004 | |
| JP | 2004-098266 | 4/2004 | |
| JP | 2005-014148 | 1/2005 | |
| JP | 2005-153106 | 6/2005 | |
| JP | 2012-131017 | 7/2012 | |
| JP | 2012-131018 | 7/2012 | |
| JP | 2015-155142 | 8/2015 | |
| SU | 1495100 | 7/1989 | |
| WO | WO 94-027833 | 12/1994 | |
| WO | WO 2010-041645 | 4/2010 | |
| WO | WO 2012-112305 | 8/2012 | |
| WO | WO 2014-062701 | 4/2014 | |
| WO | WO 2015-100018 | 7/2015 | |
| WO | WO 2015-100020 | 7/2015 | |
| WO | WO 2015-100220 | 7/2015 | |
| WO | WO 2016-044158 | 3/2016 | |
| WO | WO 2016-064726 | 4/2016 | |
| WO | WO 2016-081302 | 5/2016 | |
| WO | WO 2016-205267 | 12/2016 | |
| WO | WO 2017-007703 | 1/2017 | |
| WO | WO 2017-007714 | 1/2017 | |
| WO | WO 2017-083255 | 5/2017 | |
| WO | WO 2017-136188 | 8/2017 | |
| WO | WO 2018-080703 | 5/2018 | |
| WO | WO 2018-080704 | 5/2018 | |
| WO | WO 2018-080705 | 5/2018 | |
| WO | WO 2018-080755 | 5/2018 | |
| WO | WO 2018-080756 | 5/2018 | |
| WO | WO 2018-080765 | 5/2018 | |
| WO | WO 2018-080784 | 5/2018 | |
| WO | WO 2018-080799 | 5/2018 | |

(56) References Cited

OTHER PUBLICATIONS

Rampal, "Comparing the Magnetic Abrasives by Investigating the Surface Finish," Journal of Engineering, Computers & Applied Sciences (JEC&AS), Oct. 2012, vol. 1, No. 1, pp. 20-24.
International Search Report for PCT International Application No. PCT/US2018/013067, mailed on Mar. 14, 2018, 5 pages.

* cited by examiner

MAGNETICALLY ASSISTED DISPOSITION OF MAGNETIZABLE ABRASIVE PARTICLES

CROSS REFERENCE TO RELATED APPLICATIONS

This application is a national stage filing under 35 U.S.C. 371 of PCT/US2018/013067, filed Jan. 10, 2018, which claims the benefit of U.S. Provisional Application No. 62/449,312, filed Jan. 23, 2017, the disclosures of which are incorporated by reference in their entireties herein.

TECHNICAL FIELD

This document pertains generally, but not by way of limitation, to abrasive particles, abrasive articles, and related apparatuses, systems and methods.

BACKGROUND

Various types of abrasive articles are known in the art. For example, coated abrasive articles generally have abrasive particles adhered to a backing by a resinous binder material. Examples include sandpaper and structured abrasives having precisely shaped abrasive composites adhered to a backing. The abrasive composites generally include abrasive particles and a resinous binder.

Bonded abrasive wheels include abrasive rods bonded together by a bonding medium (i.e., a binder) in the shape of a circular wheel, typically around a central hub. Bonded abrasive wheels include, for example, grinding wheels and cut-off wheels. The bonding medium may be an organic resin (e.g., resin bond wheels), but may also be an inorganic material such as a ceramic or glass (i.e., vitreous bond wheels).

Coated abrasive articles are conventionally coated by either drop coating or electrostatic coating of the abrasive particles onto a resin-coated backing. Of the two methods, electrostatic coating has been often preferred, as it provides some degree of orientation control for particles having an aspect ratio other than one.

In general, positioning and orientation of the abrasive particles and their cutting points is important in determining abrasive performance and orientation. PCT International Publ. No. WO 2012/112305 A2 (Keipert) discloses coated abrasive articles manufactured through use of precise screens having precisely spaced and aligned non-circular apertures to hold individual abrasive particles in fixed positions that can be used to rotationally align a surface feature of the abrasive particles in a specific z-direction rotational orientation. In that method, a screen or perforated plate is laminated to an adhesive film and loaded with abrasive particles. The orientation of the abrasive particles could be controlled by the screen geometry and the restricted ability of the abrasive particles to contact and adhere to the adhesive through the screen openings. Removal of the adhesive layer from the filled screen transferred the oriented abrasive particles in an inverted fashion to an abrasive backing. The method relies on the presence of adhesive which can be cumbersome, prone to detackifying (e.g., due to dust deposits) over time, and which can transfer to the resultant coated abrasive article creating the possibility of adhesive transfer to, and contamination of, a workpiece.

OVERVIEW

Relative positioning, alignment and orientation of abrasive particles in an abrasive article can be important. If the abrasive particles are inverted (so as to be base up) or are out of alignment with respect to a cutting direction, a premature breakdown of the abrasive article can occur. Conventional methods such as drop coating and electrostatic deposition provide a random distribution of spacing and grain clustering often results where two or more shaped abrasive particles end up touching each other near the tips or upper surfaces of the shaped abrasive particles. Clustering can lead to poor cutting performance due to local enlargement of bearing areas in those regions and inability of the shaped abrasive particles in the cluster to fracture and breakdown properly during use because of mutual mechanical reinforcement. Clustering can create undesirable heat buildup compared to coated abrasive articles having more uniformly spaced shaped abrasive particles.

In view of the foregoing, the present inventors have recognized, among other things, that a variety of abrasive articles can benefit from more precise positioning and orientation of abrasive particles. As such, the present inventors have developed processes, systems and apparatuses that use magnetic fields to control the magnetizable abrasive particles alignment, placement and orientation on a backing. More particularly, the present inventors have discovered that an applied magnetic field can be concentrated at and closely adjacent the backing and such concentrated magnetic field can be used to attract the magnetizable abrasive particles to achieve a desired alignment, placement and orientation on the backing. Such concentration of the magnetic field can be accomplished by disposing a magnet or a tool having a plurality of magnetizable portions disposed at or closely adjacent the backing. The processes, systems and apparatuses can achieve desired spacing, alignment and orientation of abrasive particles in an abrasive articles, thereby reducing the likelihood of premature breakdown and poor cutting performance.

The processes, systems and apparatuses can position and/or orient the magnetizable abrasive particles as desired. In some embodiments, a non-random predetermined pattern to the magnetizable abrasive particles within the abrasive article can be achieved as a result of the distribution device and the magnetic field. The magnetic field can be applied to the magnetizable abrasive particles during transfer from the distribution device to the backing to improve the propensity of the magnetizable abrasive particles to be oriented, positioned and/or aligned as desired once received on the backing.

According to one exemplary embodiment, a method of making an abrasive article is disclosed. The method can comprise: providing a tool that has a first portion that comprises a first material and a second portion that comprises a second material, wherein the second material differs from the first material and the tool is subject to a magnetic field, and wherein the first material and the second material are provided such that the magnetic field is relatively stronger at and adjacent the first portion relative to the magnetic field at and adjacent the second portion; positioning a surface adjacent to the tool so as to be subject to the magnetic field; and disposing magnetizable abrasive particles on the surface, wherein the magnetizable abrasive particles are attracted to an area on the surface adjacent the first portion where the magnetic field is relatively stronger so as to provide for at least one of a desired orientation, placement and alignment of a majority of the magnetizable abrasive particles on the surface.

According to another exemplary embodiment, a system for producing an abrasive article is disclosed. The system can comprise: a magnet; a tool having a first portion comprised of a magnetizable material and second portion comprised of a non-magnetizable material, the magnet subjecting the tool to a magnetic field such that both the first portion and the second portion are subject to the magnetic field, wherein the magnetic field is concentrated at the first portion relative to the second portion; a backing; and magnetizable abrasive particles configured to be attracted to one or more areas on the backing at or adjacent where the magnetic field is concentrated when the tool is positioned adjacent the backing and magnet so as to be subject to the magnetic field, whereby the concentrated magnetic field provides for at least one of a desired orientation, placement and alignment of the magnetizable abrasive particles on the backing.

According to yet another exemplary embodiment, a coated abrasive article is disclosed. The coated abrasive article can comprise: a backing having first and second opposed major surfaces; and an abrasive layer disposed on the first major surface of the backing, wherein the abrasive layer comprises a first binder material and magnetizable abrasive particles, wherein the magnetizable abrasive particles are arranged according to a predetermined pattern as a result of a concentrated magnetic field being applied to the abrasive layer and backing prior to curing.

According to another exemplary embodiment, a bonded abrasive article is disclosed. The bonded abrasive article can comprise: a first curable composition that comprises a filler abrasive particles dispersed in a first organic binder precursor; a first porous reinforcing material disposed on the first curable composition; and a second curable composition disposed on the porous reinforcing material and first curable composition, wherein the second curable composition comprises magnetizable abrasive particles dispersed in a second organic binder precursor; wherein the magnetizable abrasive particles are arranged according to a predetermined pattern as a result of a concentrated magnetic field being applied to the bonded abrasive article prior to curing.

According to yet another exemplary embodiment, a method of making an abrasive article is disclosed. The method can comprise: providing a tool that has one or more first portions of a magnetizable material and one or more second portions of a non-magnetizable material; applying a magnetic field to the tool such that both the first portions and the second portions are subject to the magnetic field, wherein the magnetic field is concentrated at and adjacent the first portions relative to the second portions; positioning a backing adjacent to the tool so as to be subject to the magnetic field; and disposing magnetizable abrasive particles on the backing, wherein the magnetizable abrasive particles are attracted to one or more areas on the backing where the magnetic field is concentrated so as to provide for at least one of a desired orientation, placement and alignment of the magnetizable abrasive particles on the backing.

As used herein:

The term "a", "an", and "the" are used interchangeably with "at least one" to mean one or more of the elements being described.

The term "and/or" means either or both. For example "A and/or B" means only A, only B, or both A and B.

The terms "including," "comprising," or "having," and variations thereof, are meant to encompass the items listed thereafter and equivalents thereof as well as additional items.

Unless specified or limited otherwise, the term "coupled" and variations thereof are used broadly and encompass both direct and indirect couplings.

The phrase "major surface" or variations thereof, are used to describe an article having a thickness that is small relative to its length and width. The length and width of such articles can define the "major surface" of the article, but this major surface, as well as the article, need not be flat or planar. For example, the above phrases can be used to describe an article having a first ratio ($R_1$) of thickness (e.g., in a Z direction that is orthogonal to a major surface of the article at any point along the major surface) to a first surface dimension of the major surface (e.g., width or length), and a second ratio ($R_2$) of thickness to a second surface dimension of the major surface, where the first ratio ($R_1$) and the second ratio ($R_2$) are both less than 0.1. In some embodiments, the first ratio ($R_1$) and the second ratio ($R_2$) can be less than 0.01; in some embodiments, less than 0.001; and in some embodiments, less than 0.0001. Note that the two surface dimensions need not be the same, and the first ratio ($R_1$) and the second ratio ($R_2$) need not be the same, in order for both the first ratio ($R_1$) and the second ratio ($R_2$) to fall within the desired range. In addition, none of the first surface dimension, the second surface dimension, the thickness, the first ratio ($R_1$), and the second ratio ($R_2$) need to be constant in order for both the first ratio ($R_1$) and the second ratio ($R_2$) to fall within the desired range.

The term "ceramic" refers to any of various hard, brittle, heat- and corrosion-resistant materials made of at least one metallic element (which can include silicon) combined with oxygen, carbon, nitrogen, or sulfur.

The term "conductive" means electrically conductive (e.g., at the level of a conductor), unless otherwise specified.

The term "ferrimagnetic" refers to materials that exhibit ferrimagnetism. Ferrimagnetism is a type of permanent magnetism that occurs in solids in which the magnetic fields associated with individual atoms spontaneously align themselves, some parallel, or in the same direction (as in ferromagnetism), and others generally antiparallel, or paired off in opposite directions (as in antiferromagnetism). The magnetic behavior of single crystals of ferrimagnetic materials can be attributed to the parallel alignment; the diluting effect of those atoms in the antiparallel arrangement keeps the magnetic strength of these materials generally less than that of purely ferromagnetic solids such as metallic iron. Ferrimagnetism occurs chiefly in magnetic oxides known as ferrites. The spontaneous alignment that produces ferrimagnetism is entirely disrupted above a temperature called the Curie point, characteristic of each ferrimagnetic material. When the temperature of the material is brought below the Curie point, ferrimagnetism revives.

The term "ferromagnetic" refers to materials that exhibit ferromagnetism. Ferromagnetism is a physical phenomenon in which certain electrically uncharged materials strongly attract others. In contrast to other substances, ferromagnetic materials are magnetized easily, and in strong magnetic fields the magnetization approaches a definite limit called saturation. When a field is applied and then removed, the magnetization does not return to its original value. This phenomenon is referred to as hysteresis. When heated to a certain temperature called the Curie point, which is generally different for each substance, ferromagnetic materials lose their characteristic properties and cease to be magnetic; however, they become ferromagnetic again on cooling.

The terms "magnetic" and "magnetized" mean being ferromagnetic or ferrimagnetic at 20° C., unless otherwise specified.

The term "magnetizable" means that the item being referred to is magnetic or can be made magnetic using an applied magnetic field, and has a magnetic moment of at least 0.001 electromagnetic units (emu), in some cases at least 0.005 emu, and yet other cases 0.01 emu, in yet other cases 0.1 emu, although this is not a requirement.

The term "magnetic field" refers to magnetic fields that are not generated by any astronomical body or bodies (e.g., Earth or the sun). In general, magnetic fields used in practice of the present disclosure have a field strength in the region of the magnetizable abrasive particles being oriented of at least about 10 gauss (1 mT), in some cases at least about 100 gauss (10 mT), and in yet other cases at least about 1000 gauss (0.1 T).

The term "magnetizable" means capable of being magnetized or already in a magnetized state.

The term "shaped ceramic body" refers to a ceramic body that has been intentionally shaped (e.g., extruded, die cut, molded, screen-printed) at some point during its preparation such that the resulting ceramic body is non-randomly shaped. The term "shaped ceramic body" as used herein excludes ceramic bodies obtained by a mechanical crushing or milling operation.

The terms "precisely-shaped ceramic body" refers to a ceramic body wherein at least a portion of the ceramic body has a predetermined shape that is replicated from a mold cavity used to form a precursor precisely-shaped ceramic body that is sintered to form the precisely-shaped ceramic body. A precisely-shaped ceramic body will generally have a predetermined geometric shape that substantially replicates the mold cavity that was used to form the shaped abrasive particle.

The term "length" refers to the longest dimension of an object.

The term "width" refers to the longest dimension of an object that is perpendicular to its length.

The term "thickness" refers to the longest dimension of an object that is perpendicular to both of its length and width.

The term "aspect ratio" refers to the ratio length/thickness of an object.

The term "orientation", "orient" or "oriented" as it refers to the magnetizable abrasive particles provided by distribution devices and/or the magnetic fields of the present disclosure can refer to a non-random disposition of at least a majority of the particles relative to the distribution device(s) and/or the backing. For example, a majority of the magnetizable abrasive particles have a major planar surface disposed at an angle of at least 70 degrees relative to the first major surface of the backing upon transfer to the backing. These terms also can refer to major axes and dimensions of the magnetizable abrasive particles themselves. For example, the particle maximum length, height and thickness are a function of a shape of the magnetizable abrasive particle, and the shape may or may not be uniform. The present disclosure is in no way limited to any particular abrasive particle shape, dimensions, type, etc., and many exemplary magnetizable abrasive particles useful with the present disclosure are described in greater detail below. However, with some shapes, the "height", "width" and "thickness" give rise to major faces and minor side faces. Regardless of an exact shape, any magnetizable abrasive particle can have a centroid at which particle Cartesian axes can be defined. With these conventions, the particle z-axis is parallel with the maximum height, the particle y-axis is parallel with the maximum length, and the particle x-axis is parallel with the maximum thickness of the particle. As a point of reference, the particle axes can be identified for each magnetizable abrasive particle as a standalone object independent of the backing construction; once applied to the backing, a "z-axis rotation orientation" of the magnetizable abrasive particle is defined by the particle's angular rotation about a z-axis passing through the particle and through the backing to which the particle is attached at a 90 degree angle to the backing. The orientation effected by the distribution devices of the present disclosure entail dictating or limiting a spatial arrangement of the abrasive particle to a range of rotational orientations about the particle in one or more of the z-axis, the y-axis and/or the x-axis to a range of rotational orientations about the particle axes. For example, the embodiments of FIGS. 3-4A slots that are configured to limit a rotational orientation of the magnetizable abrasive particle about two axes but can be free to assume any rotational orientation about a third axis.

The term "alignment" "aligned" or "align" as it refers to the magnetizable abrasive particles provided by distribution tools and/or the magnetic fields of the present disclosure can refer to a non-random positioning of at least a majority of the magnetizable abrasive particles such that at least the majority of the magnetizable abrasive particles have a minor surface/cutting edge(s) that is positioned in a direction of cutting when the abrasive article is used.

The term "pattern" "patterned" or "patterning" as it refers to the magnetizable abrasive particles refers to a controlled spacing of either individual or groupings of the magnetizable abrasive particles. Thus, the term does not necessarily imply a particular alignment or orientation. In some instances, the pattern can have a repeated controlled spacing of either individual or groupings of the magnetizable abrasive particles. It refers to the magnetizable abrasive particles provided by distribution tools and/or the magnetic fields of the present disclosure can refer to a non-random spacing between at least a majority of the particles relative to one another whether in the distribution tool and/or disposed upon the backing.

The term "substantially" means within 35 percent (within 30 percent, in yet other cases within 25 percent, in yet other cases within 20 percent, in yet other cases within 10 percent, and in yet other cases within 5 percent) of the attribute being referred to.

Features and advantages of the present disclosure will be further understood upon consideration of the detailed description as well as the appended claims.

This overview is intended to provide an overview of subject matter of the present patent application. It is not intended to provide an exclusive or exhaustive explanation of the invention. The detailed description is included to provide further information about the present patent application.

DETAILED DESCRIPTION

Magnetizable abrasive particles are described herein by way of example and can have various configurations. For example, the magnetizable abrasive particles can be constructed of various materials including but not limited to ceramics, metal alloys, composites or the like. Similarly, the magnetizable abrasive particles can be substantially entirely constructed of magnetizable material, can have magnetizable portions disposed therein (e.g., ferrous traces), or can have magnetizable portions disposed as layers on one or more surfaces thereof (e.g., one or more surfaces can be coated with a magnetizable material) according to some examples. The magnetizable abrasive particles can be shaped according to some examples. According to other examples the magnetizable abrasive particles can comprise crush grains, agglomerates, or the like. Magnetizable abrasive particles can be used in loose form (e.g., free-flowing or in a slurry) or they can be incorporated into various abrasive articles (e.g., coated abrasive articles, bonded abrasive articles, nonwoven abrasive articles, and/or abrasive brushes).

Figure 1:
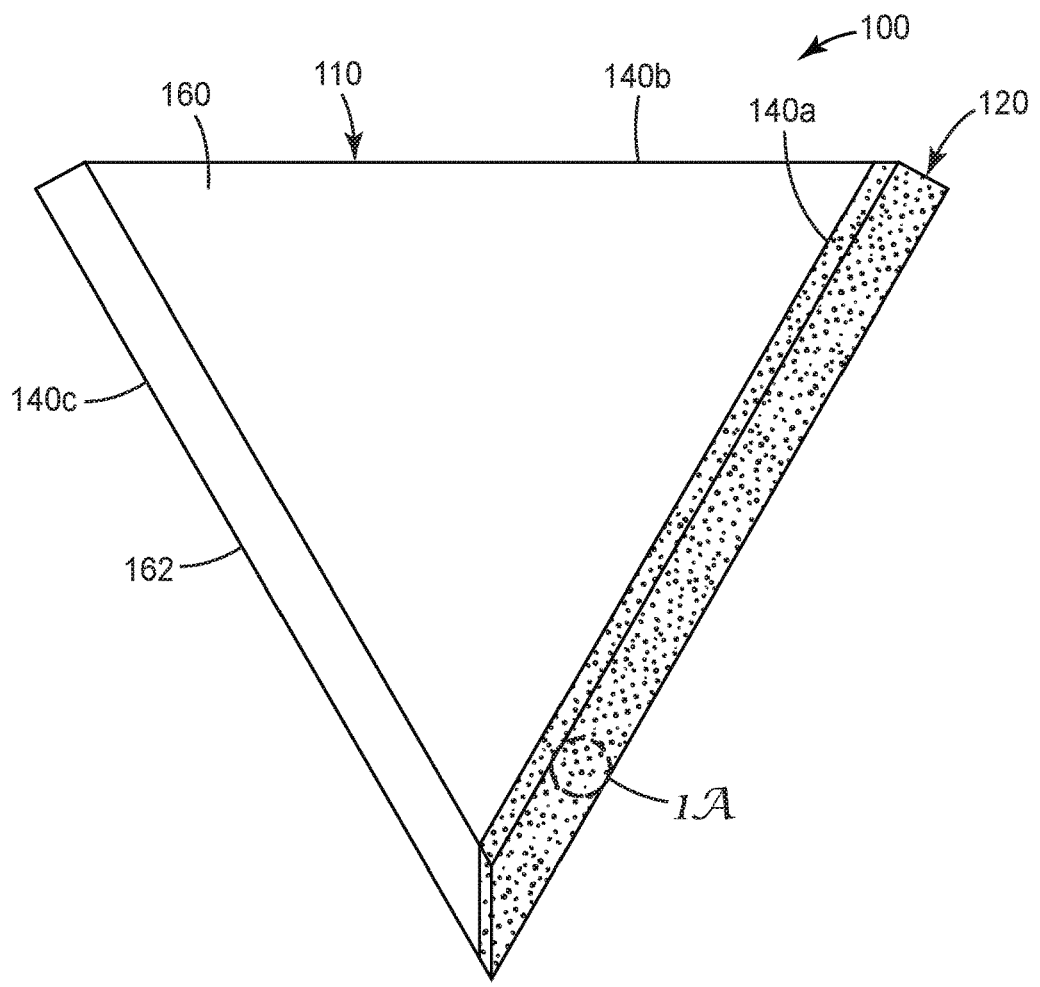
FIG. 1 is a schematic perspective view of an exemplary magnetizable abrasive particle 100 according to one embodiment of the present disclosure.
Figure 1A:
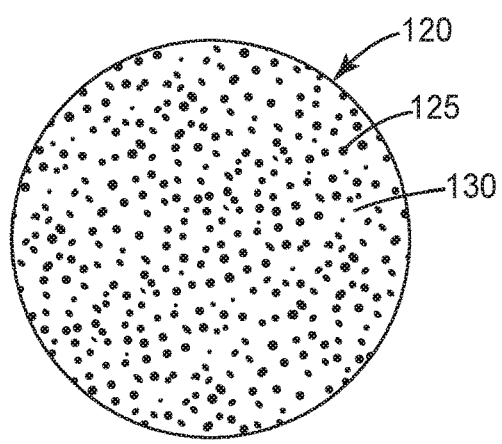
FIG. 1A is an enlarged view of region 1A in FIG. 1.

Referring now to FIGS. 1 and 1A, an exemplary magnetizable abrasive particle 100 is disclosed. The magnetizable abrasive particle 100 can have a shaped ceramic body 110 and magnetizable layer 120. The magnetizable layer 120 can be comprised of magnetizable particles 125 retained in a binder matrix 130 (also referred to simply as "binder") as further shown in FIG. 1A. The ceramic body 110 can have two opposed major surfaces 160, 162 connected to each other by three side surfaces 140a, 140b, 140c. The magnetizable layer 120 is disposed on side surface 140a of ceramic body 110.

The magnetizable layer 120 can optionally extend somewhat onto other surfaces of the shaped ceramic body 110. In some embodiments, the magnetizable layer 120 can extend to cover a majority of any surface of the shaped ceramic body 110 as desired. As shown, magnetizable layer 120 can be coextensive with side surface 140a. Magnetizable abrasive particles of the type shown can be aligned with the magnetizable layer-coated surface parallel to magnetic field lines of force as will be discussed subsequently.

In general, since orientation of the magnetic field lines tends to be different at the center and edge of a magnet it is also possible to create various desired orientations of the magnetizable abrasive particles during their inclusion into an abrasive article.

The magnetizable layer can be a unitary magnetizable material, or it can comprise magnetizable particles in a binder matrix. Suitable binders can be vitreous or organic, for example, as described for the binder matrix 130 hereinbelow. The binder matrix can be, for example selected from those vitreous and organic binders. The ceramic body can comprise any ceramic material (a ceramic abrasive material), for example, selected from among the ceramic (i.e., not including diamond) abrasive materials listed hereinbelow. The magnetizable layer can be disposed on the ceramic body by any suitable method such as, for example, dip coating, spraying, painting, physical vapor deposition, and powder coating. Individual magnetizable abrasive particles can have magnetizable layers with different degrees of coverage and/or locations of coverage. The magnetizable layer can be essentially free of (i.e., containing less than 5 weight percent of, in yet other cases containing less than 1 weight percent of) ceramic abrasive materials used in the ceramic body.

The magnetizable layer can consist essentially of magnetizable materials (e.g., >99 to 100 percent by weight of vapor coated metals and alloys thereof), or it can contain magnetizable particles retained in a binder matrix. The binder matrix of the magnetizable layer, if present, can be inorganic (e.g., vitreous) or organic resin-based, and is typically formed from a respective binder precursor.

Magnetizable abrasive particles according to the present disclosure can be prepared, for example, by applying a magnetizable layer or precursor thereof to the ceramic body. Magnetizable layers can be provided by physical vapor deposition as discussed hereinbelow. Magnetizable layer precursors can be provided as a dispersion or slurry in a liquid vehicle. The dispersion or slurry vehicle and can be made by simple mixing of its components (e.g., magnetizable particles, optional binder precursor, and liquid vehicle), for example. Exemplary liquid vehicles include water, alcohols (e.g., methanol, ethanol, propanol, butanol, ethylene glycol monomethyl ether), ethers (e.g., glyme, diglyme), and combinations thereof. The dispersion or slurry can contain additional components such as, for example, dispersant, surfactant, mold release agent, colorant, defoamer, and rheology modifier. Typically, after coating onto the ceramic bodies the magnetizable layer precursor is dried to remove most or all of the liquid vehicle, although this is not a requirement. If a curable binder precursor is used, then a curing step (e.g., heating and/or exposure to actinic radiation) generally follows to provide the magnetizable layer.

Vitreous binder can be produced from a precursor composition comprising a mixture or combination of one or more raw materials that when heated to a high temperature melt and/or fuse to form a vitreous binder matrix. Further disclosure of appropriate vitreous binders that can be used with the abrasive article can be found in U.S. Provisional Pat. Appl. Ser. Nos. 62/412,402, 62/412,405, 62/412,411, 62/412,416, 62/412,427, 62/412,440, 62/412,459, and 62/412,470, which are each incorporated herein by reference in their entirety.

In some embodiments, the magnetizable layer can be deposited using a vapor deposition technique such as, for example, physical vapor deposition (PVD) including magnetron sputtering. PVD metallization of various metals, metal oxides and metallic alloys is disclosed in, for example, U.S. Pat. No. 4,612,242 (Vesley) and U.S. Pat. No. 7,727, 931 (Brey et al.). Magnetizable layers can typically be prepared in this general manner, but care should be generally taken to prevent the vapor coating from covering the entire surface of the shaped ceramic body. This can be accomplished by masking a portion of the ceramic body to prevent vapor deposition.

Examples of metallic materials that can be vapor coated include stainless steels, nickel, cobalt. Exemplary useful magnetizable particles/materials can comprise: iron; cobalt; nickel; various alloys of nickel and iron marketed as Permalloy in various grades; various alloys of iron, nickel and cobalt marketed as Fernico, Kovar, FerNiCo I, or FerNiCo II; various alloys of iron, aluminum, nickel, cobalt, and sometimes also copper and/or titanium marketed as Alnico in various grades; alloys of iron, silicon, and aluminum (typically about 85:9:6 by weight) marketed as Sendust alloy; Heusler alloys (e.g., $Cu_2MnSn$); manganese bismuthide (also known as Bismanol); rare earth magnetizable materials such as gadolinium, dysprosium, holmium, europium oxide, and alloys of samarium and cobalt (e.g., $SmCo_5$); MnSb; ferrites such as ferrite, magnetite; zinc ferrite; nickel ferrite; cobalt ferrite, magnesium ferrite, barium ferrite, and strontium ferrite; and combinations of the foregoing. In some embodiments, the magnetizable material comprises at least one metal selected from iron, nickel, and cobalt, an alloy of two or more such metals, or an alloy of at one such metal with at least one element selected from phosphorus and manganese. In some embodiments, the magnetizable material is an alloy containing 8 to 12 weight percent (wt. %) aluminum, 15 to 26 wt. % nickel, 5 to 24 wt. % cobalt, up to 6 wt. % copper, up to 1 wt. % titanium, wherein the balance of material to add up to 100 wt. % is iron. Alloys of this type are available under the trade designation "ALNICO".

Useful abrasive materials that can be used as ceramic bodies include, for example, fused aluminum oxide, heat treated aluminum oxide, white fused aluminum oxide, ceramic aluminum oxide materials such as those commercially available as 3M CERAMIC ABRASIVE GRAIN from 3M Company of St. Paul, Minnesota, black silicon carbide, green silicon carbide, titanium diboride, boron carbide, tungsten carbide, titanium carbide, cubic boron nitride, garnet, fused alumina zirconia, sol-gel derived ceramics (e.g., alumina ceramics doped with chromia, ceria, zirconia, titania, silica, and/or tin oxide), silica (e.g., quartz, glass beads, glass bubbles and glass fibers), feldspar, or flint. Examples of sol-gel derived crushed ceramic particles can be found in U.S. Pat. No. 4,314,827 (Leitheiser et al.), U.S. Pat. No. 4,623,364 (Cottringer et al.); U.S. Pat. No. 4,744, 802 (Schwabel), U.S. Pat. No. 4,770,671 (Monroe et al.); and U.S. Pat. No. 4,881,951 (Monroe et al.).

As discussed previously, the body of the abrasive particle can be shaped (e.g., precisely-shaped) or random (e.g., crushed). Shaped abrasive particles and precisely-shaped ceramic bodies can be prepared by a molding process using sol-gel technology as described in U.S. Pat. No. 5,201,916 (Berg); U.S. Pat. No. 5,366,523 (Rowenhorst (Re 35,570)); and U.S. Pat. No. 5,984,988 (Berg). U.S. Pat. No. 8,034,137 (Erickson et al.) describes alumina particles that have been formed in a specific shape, then crushed to form shards that retain a portion of their original shape features. In some embodiments, the ceramic bodies are precisely-shaped (i.e., the ceramic bodies have shapes that are at least partially determined by the shapes of cavities in a production tool used to make them).

Exemplary shapes of ceramic bodies include crushed, pyramids (e.g., 3-, 4-, 5-, or 6-sided pyramids), truncated pyramids (e.g., 3-, 4-, 5-, or 6-sided truncated pyramids), cones, truncated cones, rods (e.g., cylindrical, vermiform), and prisms (e.g., 3-, 4-, 5-, or 6-sided prisms).

Exemplary magnetizable materials that can be suitable for use in magnetizable particles can comprise: iron; cobalt; nickel; various alloys of nickel and iron marketed as Permalloy in various grades; various alloys of iron, nickel and cobalt marketed as Fernico, Kovar, FerNiCo I, or FerNiCo II; various alloys of iron, aluminum, nickel, cobalt, and sometimes also copper and/or titanium marketed as Alnico in various grades; alloys of iron, silicon, and aluminum (typically about 85:9:6 by weight) marketed as Sendust alloy; Heusler alloys (e.g., $Cu_2MnSn$); manganese bismuthide (also known as Bismanol); rare earth magnetizable materials such as gadolinium, dysprosium, holmium, europium oxide, alloys of neodymium, iron and boron (e.g., $Nd_2Fe_{14}B$), and alloys of samarium and cobalt (e.g., $SmCo_5$); MnSb; $MnOFe_2O_3$; $Y_3Fe_5O_{12}$; $CrO_2$; MnAs; ferrites such as ferrite, magnetite; zinc ferrite; nickel ferrite; cobalt ferrite, magnesium ferrite, barium ferrite, and strontium ferrite; yttrium iron garnet; and combinations of the foregoing. In some embodiments, the magnetizable material comprises at least one metal selected from iron, nickel, and cobalt, an alloy of two or more such metals, or an alloy of at one such metal with at least one element selected from phosphorus and manganese. In some embodiments, the magnetizable material is an alloy (e.g., Alnico alloy) containing 8 to 12 weight percent (wt. %) aluminum, 15 to 26 wt. % nickel, 5 to 24 wt. % cobalt, up to 6 wt. % copper, up to 1 wt. % titanium, wherein the balance of material to add up to 100 wt. % is iron.

The magnetizable abrasive particles can have any size, but can be much smaller than the ceramic bodies as judged by average particle diameter, in yet other cases 4 to 2000 times smaller, in yet other cases 100 to 2000 times smaller, and in yet other cases 500 to 2000 times smaller, although other sizes can also be used. In this embodiment, the magnetizable particles can have a Mohs hardness of 6 or less (e.g., 5 or less, or 4 or less), although this is not a requirement.

Figure 2:
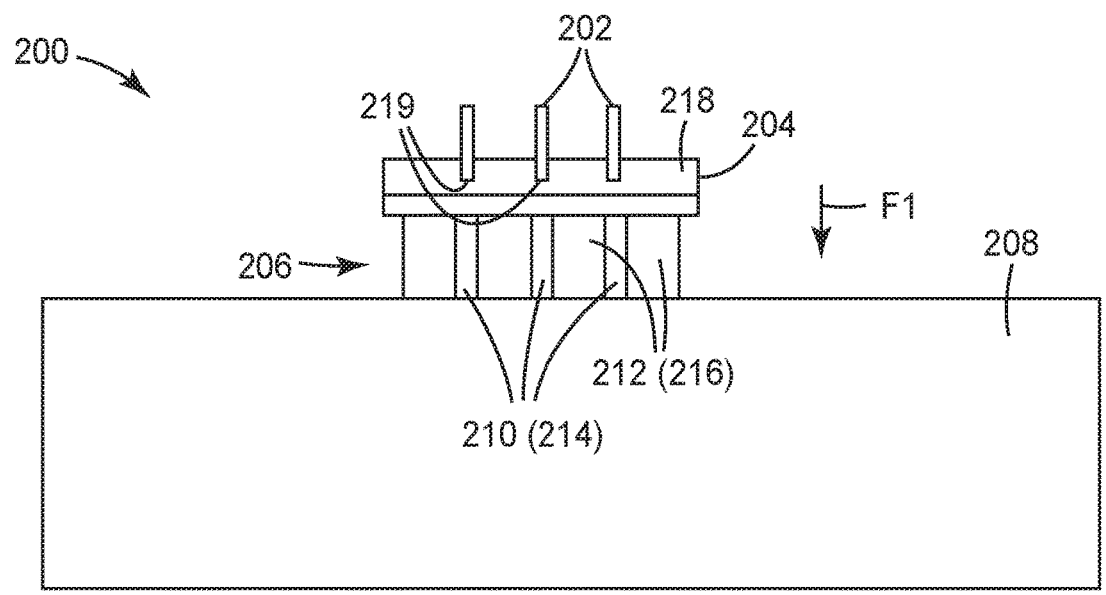
FIG. 2 is schematic view of an apparatus that utilizes a magnetic field to orient, align and/or position the magnetizable abrasive particles such as those of FIG. 1 according to an example of the present disclosure.

FIG. 2 shows an apparatus 200 for making abrasive articles according to one embodiment of the present disclosure. The apparatus 200 is operable to provide magnetizable abrasive particles 202 a desired orientation, placement and/ or alignment of the magnetizable abrasive particles on a backing 204. The magnetizable abrasive particles 202 can have a construction similar to those previously illustrated and described. These magnetizable abrasive particles 202 can be disposed on the backing 204 by a distribution device (not shown) as will be discussed subsequently. The apparatus 200 can include a tool 206 and a base 208. The tool 206 is comprised of a first portion 210 and a second portion 212. According to the embodiment of FIG. 2, the first portion 210 is comprised of magnetizable material 214 of a ferrous material, for example. The second portion 212 is comprised of a non-magnetizable material 216 (e.g., a plastic, non-ferrous metal, composite, void or the like). The magnetizable material 214 and a non-magnetizable material 216 are arranged in a predetermined pattern as shown in FIG. 2. However, according to other embodiments the first portion 210 can comprise one or more magnets (permanent or electromagnet) rather than just a magnetizable material. The base 208 need not be utilized in each embodiment, and if utilized can comprise any one or any combination of a magnet (permanent or electromagnet), a magnetizable material or a non-magnetizable material.

The apparatus 200 of FIG. 2 has the base 208 coupled to the tool 206. The tool 206 can be disposed in close proximity to (a sufficient distance such that the magnetic field can reach the backing 204) or contacting the backing 204. The magnetizable abrasive particles 202 can be disposed on the backing 204 such as on a first major surface 218 thereof. As shown in FIG. 2, the magnetizable abrasive particles 202 can be disposed on the first major surface 218 and can be generally positioned above the first portion 210 (the magnetizable material 214). Such positioning can be the result of a magnetic field as indicated by arrow F1 in FIG. 1, which is concentrated by the first portion 210 (the magnetizable material 214). Such concentration of the magnetic force F1 can occur at or adjacent desired areas 219 of the backing 204 such as at or closely adjacent a first end of each of the magnetizable material 214. FIGS. 11-14A show various plots of the magnetic field concentrations and how the magnetic field is concentrated in the region adjacent a tip of the magnet or the magnetizable portion of the tool as is discussed in further detail subsequently.

The apparatus 200 can be used as part of a batch or continuous process as will be described subsequently. Only a portion of the backing 204 is shown in FIG. 2. The backing 204 can be part of a web that translates or can be a disc or other shaped item that is held in a static position relative to the apparatus 200 as is discussed subsequently herein. According to one embodiment, the backing 204, can have a make coat resin applied to a first major surface 218 thereof. The backing 204 can be a cloth, paper, film, nonwoven, scrim, or other web substrate. Alternatively, a pre-coated coated backing can be utilized for application of the abrasive particles to the first major surface 218.

The apparatus 200 can be used to make an abrasive article according to the following method. The method can provide for a tool, such as the tool 206 previously discussed. According to one embodiment, the tool 206 can have the magnetizable material 214 and the non-magnetizable material 216. The magnetic force F1 is applied to the tool 206 such that both the magnetizable material 214 and a non-magnetizable material 216 are subject to the magnetic force F1. The magnetic force F1 is concentrated at the magnetizable material 214 relative to the non-magnetizable material 216. The backing 204 is positioned adjacent to the tool 206 so as to be subject to the magnetic force F1. The magnetizable abrasive particles 202 are disposed on the backing 204 and are attracted to one or more areas 219 on the backing 204 where the magnetic force F1 is concentrated so as to provide for at least one of a desired orientation, placement and alignment of the magnetizable abrasive particles 202 on the backing 204.

Figure 3:
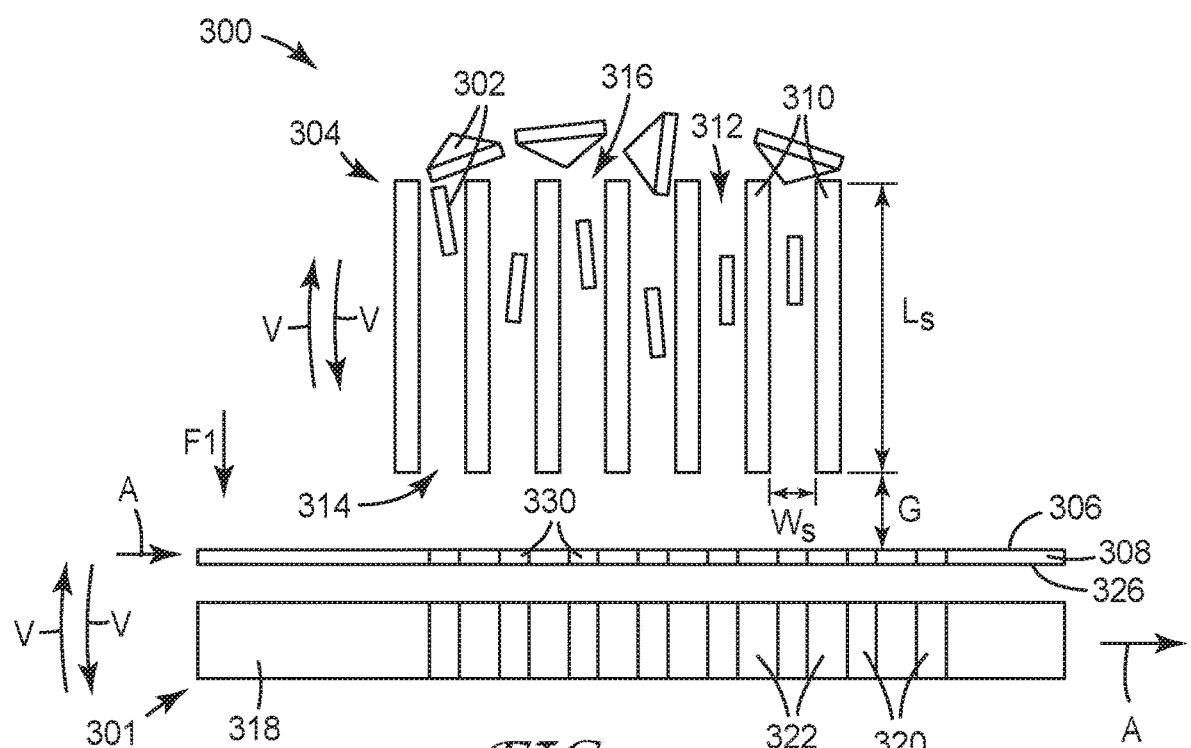
FIG. 3 is a schematic view of a distribution device according to another embodiment, the distribution device receiving magnetizable abrasive particles and passing the particles through slots formed by the distribution device to a backing having an apparatus positioned adjacent thereto to exert a magnetic field on the backing and the magnetizable abrasive particles according to an example of the present disclosure.

FIG. 3 shows a system 300 that can be used with an apparatus 301 having a similar construction to the apparatus 200 previously described with reference to FIG. 2. The system 300 can include a distribution device 304 in addition to the apparatus 301. Magnetizable abrasive particles 302 (a size of which is exaggerated in FIG. 3 for ease of understanding) are applied to a first major surface 306 of a backing 308 by the distribution device 304. The distribution device 304 is configured to distribute the magnetizable abrasive particles 302 from a source as described in further detail below. After application of the magnetizable abrasive particles 302, the backing 308 exits from below the distribution device 304. The magnetizable abrasive particles 302 can optionally be subjected to further processing (e.g., vibration to orient or align particles and/or to facilitate particles passing through the distribution device, application of a size coat, application of additional abrasive particles by conventional means (e.g., e-coat), application of a grinding aid, application of a supersize coat, curing, cutting, etc.) to produce a final abrasive article, such as a coated abrasive article as has previously been discussed herein.

The distribution device 304 is configured to impart at least one of a predetermined orientation and alignment of at least a majority of the magnetizable abrasive particles 302 as applied to and subsequently bonded to the first major face 306 of the backing 308. With this in mind, the distribution device 304 is shown in simplified form in FIG. 3. In general terms, the distribution device 304 can have any a shape, not just the rectangular shape illustrated. The distribution device 304 has a plurality of walls 310 that are generally transversely oriented relative to the first major surface 306 of the backing 308. The plurality of walls 310 define a plurality of slots 312 therebetween. The slots 312 are each open to a dispensing surface 314 of the distribution device 304 interfacing with the backing 308 spaced therefrom by a gap G.

The distribution device 304 can have or define a feed surface 316 such as a central bore in some embodiments. The feed surface 316 can comprise a plurality of interior surfaces that can be configured to receive the magnetizable abrasive particles 302 as a feed. Each of the slots 312 are also open to the central portion. The distribution device 304 is configured to distribute the magnetizable abrasive particles 302 from the feed surface 316 to the dispensing surface 314 thereof in a manner that imparts at least one of an orientation, spacing and alignment the magnetizable abrasive particles 302. For example, the slots 312 extend in a cross-web as well as a down-web direction and each have a substantially similar width $W_S$ (e.g., the width $W_S$ of the slots 312 can vary from one another by no more than 10%) that is selected in accordance with expected nominal dimensions of the magnetizable abrasive particles 302 so as to bias the magnetizable abrasive particles 302 to at least one of the predetermined orientation and alignment at the dispensing surface 314.

In the embodiment of FIG. 3, the walls 310 are elongated, substantially planar (e.g., within 10% of a truly planar construction) bodies formed of a relatively rigid material (e.g., metal, plastic, ceramic, etc.). The walls 310 can be maintained relative to one another in various fashions. The length Ls of each of the slots 312 is selected in accordance with expected nominal dimensions of the magnetizable abrasive particles 302 with which the distribution device 304 will be used, including the slot length Ls being sufficient to simultaneously receive a multiplicity of the magnetizable abrasive particles 302 as illustrated. A depth of each slot 312 as defined by a depth of each wall 310 as well as the other dimensions that define the width $W_S$ and the length Ls is selected in accordance with expected nominal dimensions of the magnetizable abrasive particles 302. In some embodiments, the dimensions of each slot 312 may not be substantially identical as illustrated but can be varied as desired.

The apparatus 301 can be constructed as previously described in reference to the embodiment of the apparatus 200 of FIG. 2. In particular, the apparatus 300 can be mounted on a belt or the like to translate at substantially a similar speed to the backing 308 as indicated by arrow A. As shown in FIG. 3, the apparatus 300 has a tool 318 that comprises at least a first portion 320 and a second portion 322.

According to the exemplary embodiment of FIG. 3, the first portion 320 comprises one or more magnets (each can be a permanent or electromagnet) disposed adjacent to the distribution device 304 and the backing 308. Alternatively, the first portion 320 can comprise a magnetizable material as previously described with reference to FIG. 2. More particularly, the one or more magnets can be positioned below the backing 308 such that the backing 308 and the gap G, which space the one or more magnets from the dispensing surface 314. In some cases, the one or more magnets can abut a second major surface 326 of the backing 308. The second major surface 326 can be opposed by the first major surface 306 that receives the magnetizable abrasive particles 302 upon transfer. The one or more magnets can be disposed to be relatively nearer the second major surface 326 than the first major surface 306 according to some embodiments. In other cases, the one or more magnets can interface with the second major surface 326 of the backing 308 but can be spaced therefrom by an intermediate element. The intermediate element can comprise a void, any type of material or a composite of materials.

According to one embodiment, the one or more magnets can be spaced from one another by the second portion 322. In some embodiments, the one or more magnets can be arranged in a predetermined patterned in one or both of a down-web direction and a cross-web direction. As shown in FIG. 3, each of the one or more magnets exerts a magnetic force (illustrated as F1) on the magnetizable abrasive particles 302 when the particles are disposed on areas 330 of the first major surface 306 immediately adjacent the one or more magnets. As discussed previously, the magnetic force F1 can be concentrated in these areas 330.

For the purposes of this disclosure, the concentrated magnetic force F1 in the areas 330 can be used provide for at least one of a desired orientation, placement and alignment of the magnetizable abrasive particles 302 on the first major surface 306 of the backing 308.

In the embodiment of FIG. 3, the slots 312 generally align with earth's gravitational field and the magnetic force F1 acts on the magnetizable abrasive particles 302 in generally a same direction as the gravitational field. Thus, in the embodiment of FIG. 3, the lines of force of the magnetic force F1 are substantially perpendicular to the backing 516.

As shown in FIG. 3, according to some embodiments, one or more of the backing 308, the magnetizable abrasive particles 302 and the tool 318 can be vibrated as indicated by arrows V to enhance at least one of the orientation and alignment of the magnetizable abrasive particles on the backing.

The distribution device 304 can be disclosed closely adjacent the backing 316 but can be spaced therefrom by at least the gap G according to some embodiments. The gap G can comprise a minimum spacing between the dispensing surface 314 (an exterior surface) of the distribution device 304 and the backing 308. According to some embodiments, the gap G can be at least as large as a maximum dimension of the magnetizable abrasive particles 302. According to further embodiments, the gap G can be at least twice a maximum dimension of the magnetizable abrasive particles 302. According to yet further embodiments, the gap G can be at least three times as large a maximum dimension of the magnetizable abrasive particles 302. According to one embodiment, the gap G can be between 0.010 inches and 1.0 inches in extent as measured from a lowest most point of the distribution device 304 to the first major surface 306 of the backing 308.

Figure 4:
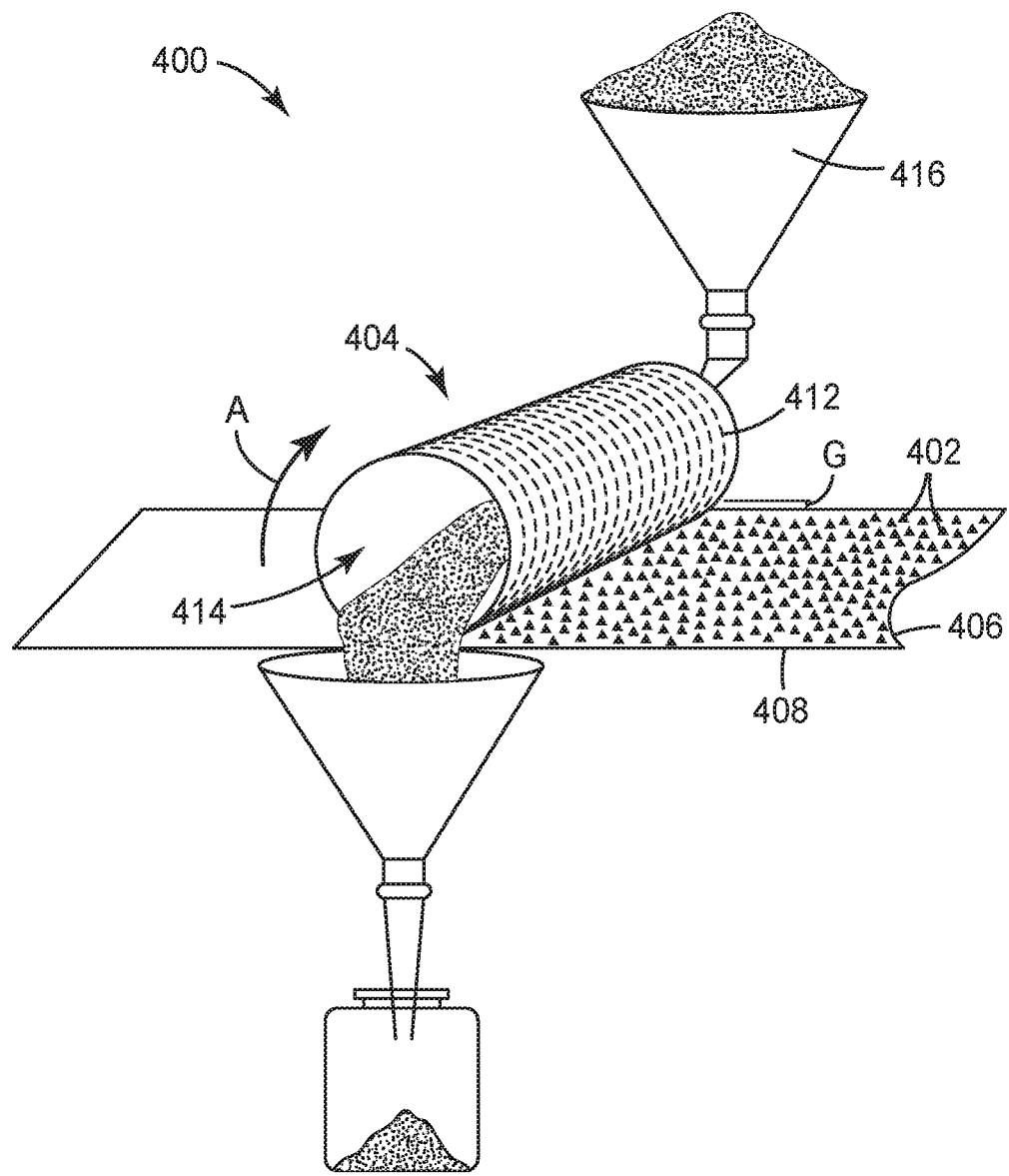
FIGS. 4 and 4A are schematic perspective views of a distribution device according to another embodiment, the distribution device receiving magnetizable abrasive particles and passing the particles through slots formed by the distribution device to a backing having an apparatus positioned adjacent thereto to exert a magnetic field on the backing and the magnetizable abrasive particles according to an example of the present disclosure.
Figure 4A:
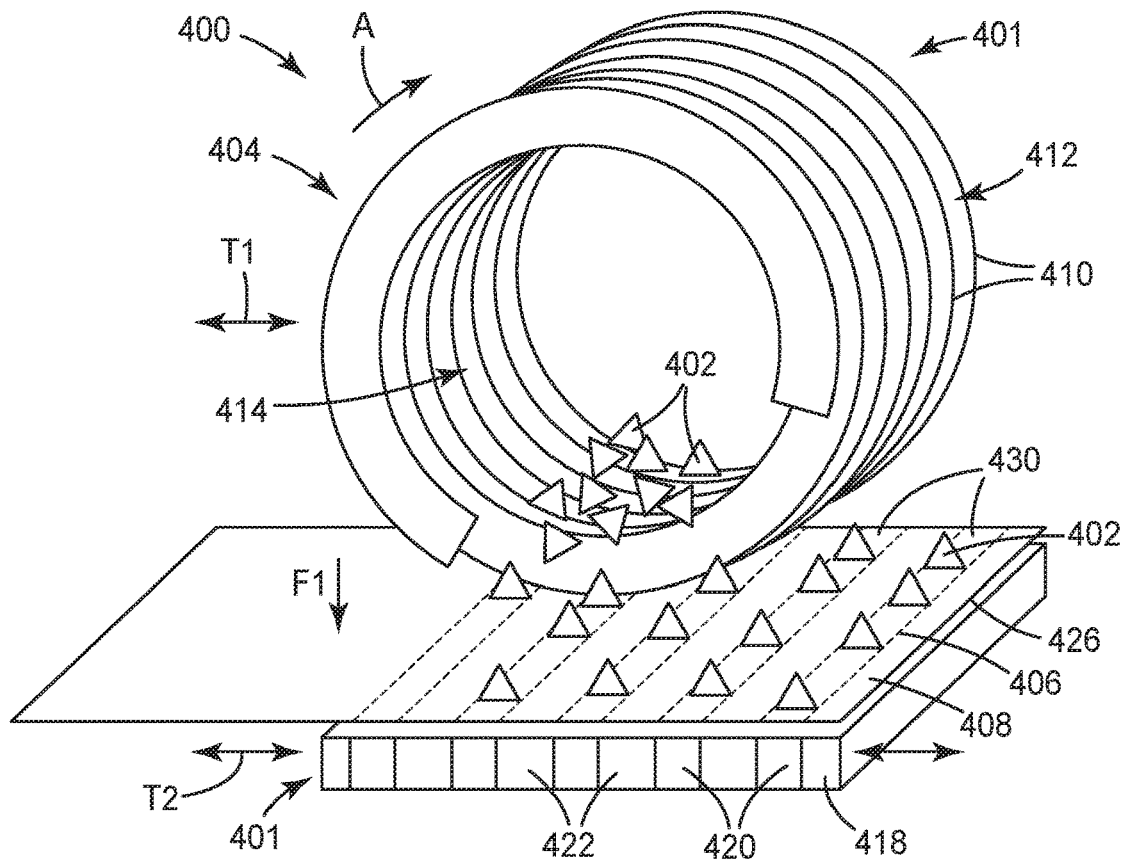

FIGS. 4 and 4A show another example of a system 400 that can be utilized with an apparatus 401 (FIG. 4A) that can be constructed in a manner similar to the apparatuses 200 and 301 previously described. FIG. 4A is an enlarged view of a portion of the apparatus 401 with the slots and particles enlarged for viewer understanding. The system 400 includes a distribution device 404 that is configured to facilitate the placement of magnetizable abrasive particles 402 onto a first major surface 406 of a backing 408. The distribution device 404 has a plurality of circumferentially extending but axially spaced apart walls 410 (FIG. 4A) that define slots 412 for the distribution device 404. In some cases, the distribution device 404 can be spaced from the backing 408 by a gap G (FIG. 4) as previously described.

The distribution device 404 has a generally cylindrical shape, for example akin to a hollow right cylinder. The slots 412 are each open to an exterior of the distribution device 404 as well as to an interior comprising a central bore 414. The distribution device 404 is configured such that the magnetizable abrasive particles 402 will become loaded into certain ones of the slots 412. The number of slots 412 provided with the distribution device 404 can selected as a function of the desired slot width and a dimension (e.g., cross-web width) of the backing 408 as previously described. In yet other embodiments, the apparatus of any of the embodiments described herein can include two or more of the distribution devices assembled in series or parallel relative to the backing.

During use, a supply of the abrasive particles 402 is loaded to the distribution device 404 via a source 416 (FIG. 4). For example, the source 416 can be akin to a mineral dropper having an outlet that extends into the central bore 414. The supply of the magnetizable abrasive particles 402 flows through the outlet and into the central bore 414. Once within the central bore 414, individual ones of the magnetizable abrasive particles 402 will enter a respective one of the slots 412 upon achieving at least one of a predetermined orientation and alignment dictated by dimensions of the slots 412. For example, FIG. 4A is a simplified representation of a portion of the distribution device 404 with a portion of the distribution device 404 removed such that the magnetizable abrasive particles 402 in the slots 412 are visible. The magnetizable abrasive particles 402 are spatially oriented so as to enter the slots 412 in one orientation (i.e. with a non-major surface interfacing with the slots 412). Such orientation (with a major surface of the particle interfacing with the slots 412 and interior of the walls 410) prevents entry of the magnetizable abrasive particles 402 into the slots 412.

By way of example, loading of the supply can include pouring or funneling (e.g., via vibratory feeder, belt driven drop coater, etc.) a large number of the magnetizable abrasive particles 402 on to (or into) the distribution device 404 under the force of gravity, with individual ones of the so-loaded magnetizable abrasive particles 402 randomly assuming any spatial orientation. With reference between FIGS. 4 and 4A, as the individual abrasive particles 402 repeatedly contact one or more of the interior of the walls 410 (FIG. 4A), baffles or other features, they re-orient and assume a new spatial orientation, eventually becoming generally aligned with and assuming a spatial orientation appropriate for entering one of the slots 412. In this regard, as the supply of the magnetizable abrasive particles 402 flows into the distribution device 404, the distribution device 404 can be rotated as shown in FIG. 4 by arrow A. This rotation can cause the magnetizable abrasive particles 402 to mix and/or vibrate around on surfaces of the distribution device 404 until they obtain a suitable orientation and fall through the slots 412. Regardless, a large number of the magnetizable abrasive particles 402 can be disposed within individual one of the slots 412 at any one point in time.

As previously described, the apparatus 401 can comprise a tool 418 that is disposed adjacent to the distribution device 404 and the backing 408 as illustrated in FIG. 4A. More particularly, the tool 418 can be positioned below the backing 408 such that the backing 408 and the gap G (FIG. 4) space the tool 418 from the exterior of the distribution device 404. Unlike the previous embodiment of FIG. 3 where the tool translated with the backing, as shown in FIG. 4A the tool 418 and the distribution device 404 translate relative to the backing 408 as indicated by arrows T1 and T2. The backing 408 is stationary. The tool 418 can be linked to the distribution device 404 to move therewith or can move independent of the distribution device 404.

The tool 418 can be comprised of a plurality of magnetizable portions 420 and a plurality of non-magnetizable portions 422 in a similar manner to the embodiment previously described in reference to FIG. 2. The plurality of magnetizable portions 420 are spaced from one another by plurality of non-magnetizable portions 422. In some embodiments, the plurality of magnetizable portions 420 can be arranged in a predetermined patterned in one or both of the down-web direction and the cross-web direction. As shown in FIG. 4A, each of the plurality of magnetizable portions 420 is subject to a magnetic field (illustrated as F1). The magnetic force F1 is generated by a magnet 424 (not shown) coupled to the tool 418 and is part of apparatus 401. The plurality of magnetizable portions 420 act to concentrate the magnetic force F1, which acts on the magnetizable abrasive particles 402 when the particles are disposed on areas 430 of the first major surface 406 immediately adjacent the plurality of magnetizable portions 420. As discussed previously, the magnetic force F1 is concentrated in the areas 430. The concentrated magnetic force F1 in the areas 430 can be used provide for at least one of a desired orientation, placement and alignment of the magnetizable abrasive particles 402 on the first major surface 406 of the backing 408.

With movement of the tool 418 relative to the backing 408, the areas 430 can shift location on the backing 408. In some cases, the magnetic force F1 may only be applied temporarily and then removed once the desired orientation, placement and alignment of the magnetizable abrasive particles 402 on the backing 408 is achieved. In other embodiments, the magnetic force F1 can be applied immediately sequent or simultaneous with at least a partial curing of the magnetizable abrasive particles 402 on the backing 408.

In the embodiment of FIG. 4A, the plurality of magnetizable portions 420 can be positioned below the backing 408 adjacent a second major surface 426 of the backing 408. In some cases, the plurality of magnetizable portions 420 can abut the second major surface 426 of the backing 408. The second major surface 426 can be opposed by the first major surface 406 that receives the magnetizable abrasive particles 402 upon transfer. The plurality of magnetizable portions 420 can be disposed to be relatively nearer the second major surface 426 than the first major surface 406 as shown in FIG. 4A.

Further distribution devices that can be used with the magnetizable abrasive particles disclosed herein can be found in PCT International Publ. Nos. WO2015/100018, WO2015/100020, WO2015/100220, WO2016/205267, WO2017/007703, and WO2017/007714 which are each incorporated herein by reference in their entirety.

Figure 5:
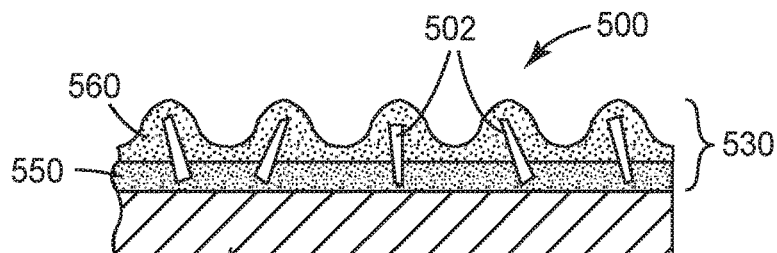
FIGS. 5 and 6 are cross-sections of coated abrasive articles having magnetizable abrasive particles that are oriented, aligned and/or positioned with the use of a magnetic field according to an example of the present disclosure.

FIG. 5 shows an exemplary coated abrasive article 500 that can be made with any of the systems or apparatuses described previously. The coated abrasive article 500 has a backing 520 and an abrasive layer 530. The abrasive layer 530, includes functional magnetizable abrasive particles 502 according to the present disclosure secured to the backing 520 by make layer 550 and size layer 560, each comprising a respective binder (e.g., epoxy resin, urethane resin, phenolic resin, aminoplast resin, or acrylic resin) that may be the same or different. Exemplary backings include woven, knitted, or nonwoven fabrics, optionally treated with one or more of a saturant, presize layer, or tie layer.

Figure 6:
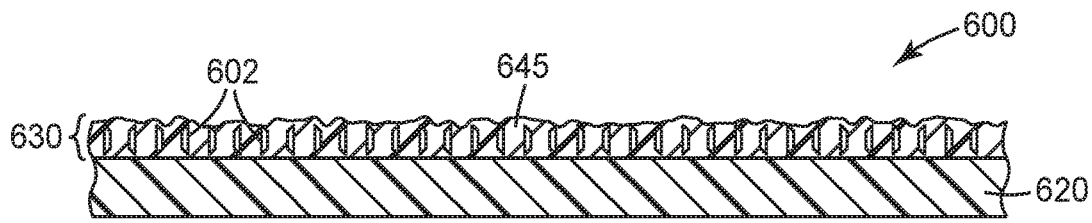

Another exemplary embodiment of a coated abrasive article 600 is shown in FIG. 6. The abrasive coat may comprise a cured slurry comprising a curable binder precursor and functional abrasive particles according to the present disclosure. Referring to FIG. 6, exemplary coated abrasive article 600 has a backing 620 and an abrasive layer 630. Abrasive layer 630 includes magnetizable abrasive particles 602 and a binder 645 (e.g., epoxy resin, urethane resin, phenolic resin, aminoplast resin, acrylic resin).

Further details concerning the manufacture of coated abrasive articles according to the present disclosure can be found in, for example, U.S. Pat. No. 4,314,827 (Leitheiser et al.), U.S. Pat. No. 4,652,275 (Bloecher et al.), U.S. Pat. No. 4,734,104 (Broberg), U.S. Pat. No. 4,751,137 (Tumey et al.), U.S. Pat. No. 5,137,542 (Buchanan et al.), U.S. Pat. No. 5,152,917 (Pieper et al.), U.S. Pat. No. 5,417,726 (Stout et al.), U.S. Pat. No. 5,573,619 (Benedict et al.), U.S. Pat. No. 5,942,015 (Culler et al.), and U.S. Pat. No. 6,261,682 (Law).

Figure 7A:
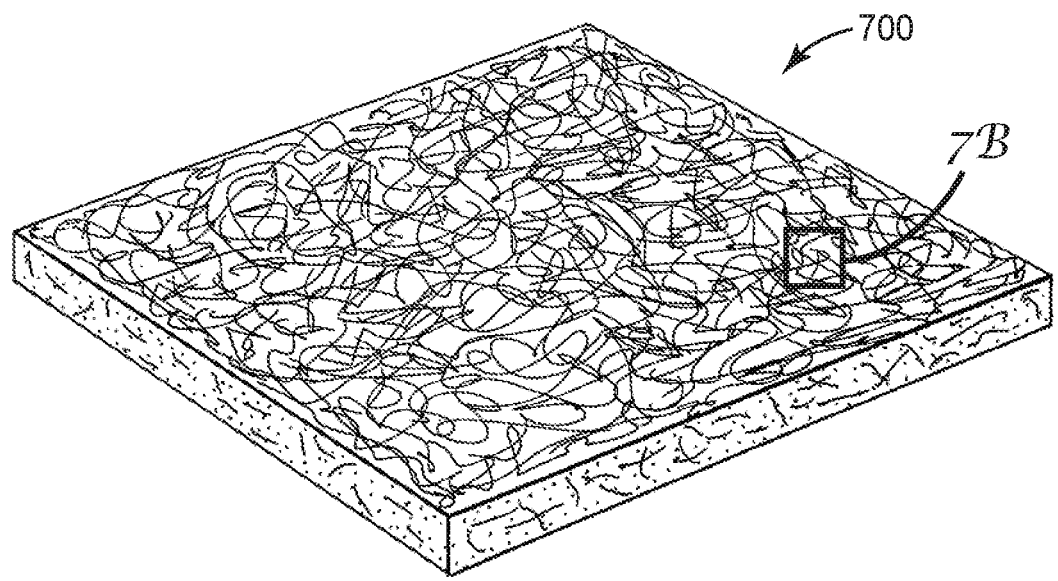
FIG. 7A is a perspective view of an exemplary non-woven abrasive article having magnetizable abrasive particles according to an example of the present disclosure.
Figure 7B:
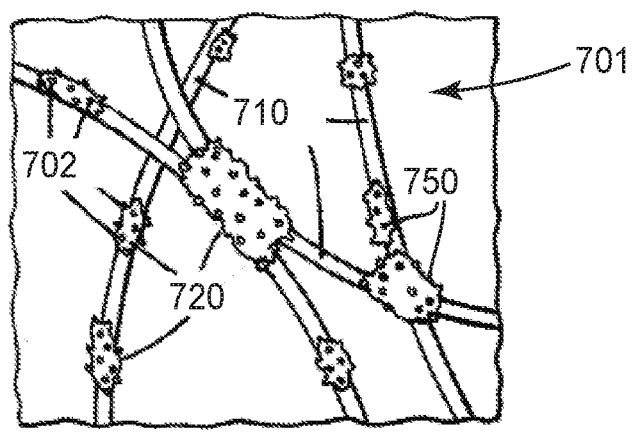
FIG. 7B is an enlarged view of region 7B in FIG. 7A.

Nonwoven abrasive articles typically include a porous (e.g., a lofty open porous) polymer filament structure having abrasive particles bonded thereto by a binder. An exemplary embodiment of a nonwoven abrasive article according to the present invention is shown in FIGS. 7A and 7B. Nonwoven abrasive article 700 includes a lofty open low-density fibrous web formed of entangled filaments 710 impregnated with binder 720 (e.g., epoxy resin, urethane resin, phenolic resin, aminoplast resin, acrylic resin). Magnetizable abrasive particles 702 according to the present disclosure are dispersed throughout the fibrous web 701 on exposed surfaces of filaments 710. A binder 720 coats portions of filaments 710 and forms globules 750, which may encircle individual filaments or bundles of filaments that adhere to the surface of the filament and/or collect at the intersection of contacting filaments, providing abrasive sites throughout the nonwoven abrasive article.

Further details concerning nonwoven abrasive articles according to the present disclosure can be found in, for example, U.S. Pat. No. 2,958,593 (Hoover et al.), U.S. Pat. No. 4,018,575 (Davis et al.), U.S. Pat. No. 4,227,350 (Fitzer), U.S. Pat. No. 4,331,453 (Dau et al.), U.S. Pat. No. 4,609,380 (Barnett et al.), U.S. Pat. No. 4,991,362 (Heyer et al.), U.S. Pat. No. 5,554,068 (Carr et al.), U.S. Pat. No. 5,712,210 (Windisch et al.), U.S. Pat. No. 5,591,239 (Edblom et al.), U.S. Pat. No. 5,681,361 (Sanders), U.S. Pat. No. 5,858,140 (Berger et al.), U.S. Pat. No. 5,928,070 (Lux), U.S. Pat. No. 6,017,831 (Beardsley et al.), U.S. Pat. No. 6,207,246 (Moren et al.), and U.S. Pat. No. 6,302,930 (Lux).

Bonded abrasive articles utilizing the magnetizable abrasive particles previously discussed are also disclosed. The magnetizable abrasive particles can be positioned and/or orientated within the corresponding binder precursor, which is then pressed and cured.

Figure 8:
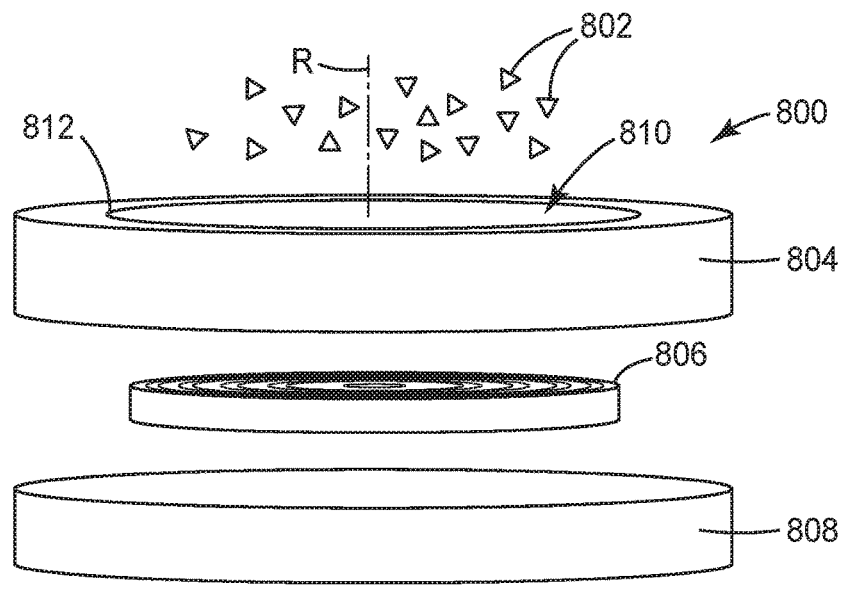
FIG. 8 is an exploded schematic view of a system that includes a mold, a tool and a magnet according to an example of the present disclosure.

FIG. 8 shows an apparatus 800 for making a bonded abrasive article comprised of magnetizable abrasive particles 802. The apparatus 800 can include a mold 804, a tool 806 and a magnet 808.

The mold 804 can have a circular mold cavity 810 therein. The mold 804 can be coupled to the tool 806 so the tool 806 can form a bottom surface of the mold cavity 810 when inserted therein. The magnet 808 (permanent or electromagnet) can be coupled below the tool 806 such that the tool 806 is disposed between the magnet 808 and the mold 804.

Figure 9A:
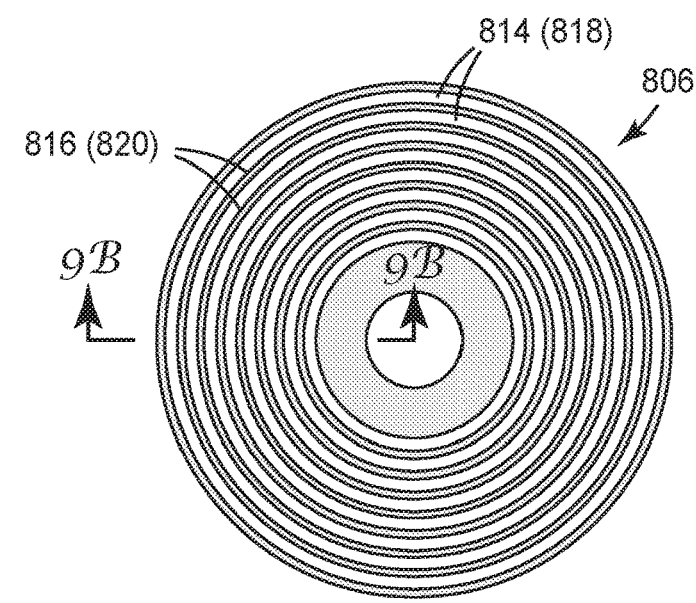
FIG. 9A is a plan view of the tool of FIG. 8 according to an example of the present disclosure.

The mold 804 can have a rotational axis R and an outer circumference 812. As shown in FIG. 9A, the tool 806 can have a first portion 814 and a second portion 816 as previously discussed. The first portion 814 can be comprised of a magnetizable material 818 while the second portion 816 can be comprised of a non-magnetizable material 820. FIG. 9A shows an exemplary patterning for the first portion 814 and the second portion 816. According to other embodiments, there may be differing patterning from the concentric series of rings shown in FIG. 9A. In yet further embodiments, the tool 806 may not have a distinct pattern but can be comprised of a plurality of distinct magnetizable traces, for example.

Figure 9B:
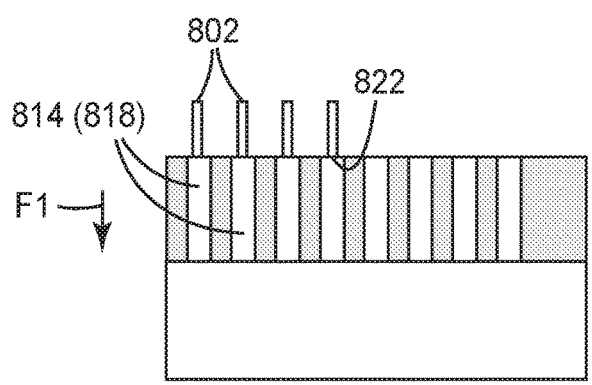
FIG. 9B is a cross-sectional view of the tool along line 9B-9B of FIG. 9A.

As shown in the cross-section of FIG. 9B, the magnetizable abrasive particles 802 can be disposed on the tool 806 and can be generally positioned above the first portion 814 (the magnetizable material 818). Such positioning can be the result of a magnetic field as indicated by arrow F1 in FIG. 9B, which is concentrated by the first portion 814. Such concentration of the magnetic force F1 can occur at or closely adjacent a first end 822 of each section of the first portion 814.

Figure 10:
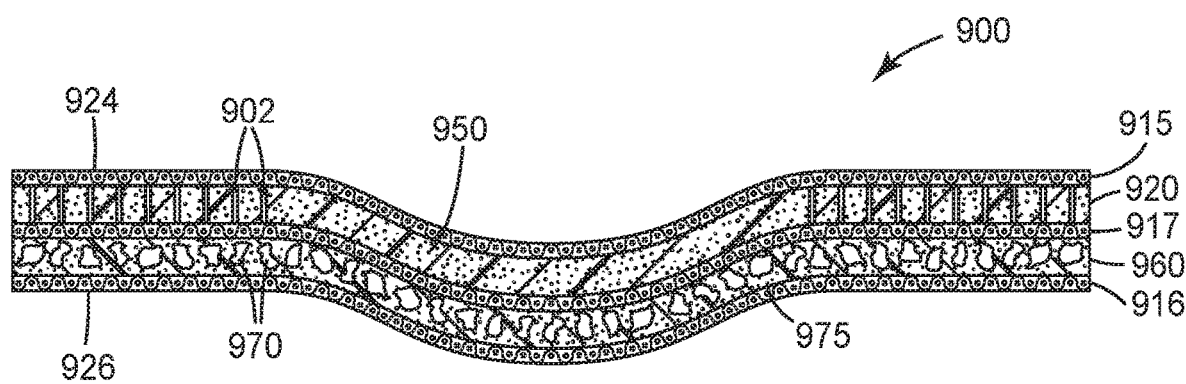
FIG. 10 is a schematic cross-sectional view of a bonded abrasive wheel that utilizes magnetizable abrasive particles according to an example of the present disclosure.

FIG. 10 shows a cross-section of a bonded abrasive article comprising a bonded abrasive wheel 900 that is formed using the apparatus 800 of FIGS. 8-9B. The bonded abrasive wheel 900 extends from front surface 924 to back surface 926, which can be used, for example, for attachment to a power driven tool (not shown). Primary abrasive layer 920 comprises magnetizable abrasive particles 902 (shown as rods) retained in binder 950. Optional secondary abrasive layer 960 comprises abrasive particles 970 (e.g., crushed abrasive particles retained in binder 975. Primary abrasive layer 920 optionally further comprises primary reinforcing material 915 adjacent to front surface 924 primary abrasive layer 920. Optional secondary abrasive layer 960 optionally further comprises secondary reinforcing material 916 adjacent to back surface 926. Optional reinforcing material 917 is sandwiched between, and/or is disposed at the junction of, primary abrasive layer 920 and secondary abrasive layer 960. In some embodiments, the primary and secondary abrasive layers contact each other, while in other embodiments they a bonded to one another through one or more additional elements (e.g., a layer of a third organic binder optionally including reinforcing material 917).

In some embodiments, more than one (e.g., at least 2, at least 3, at least 4) abrasive layer containing magnetizable abrasive particles may be included in the bonded abrasive wheel. These abrasive layers may be prepared under the same or different magnetic field orientations.

FIGS. 11-14A are plots showing the magnetic field strength modeled for various embodiments. Each embodiment is modeled as being axis-symmetric about an axis on a bottom side of the plot (the axis corresponding to a central axis of the tool 806 shown in FIG. 9A, for example). Plots 11A, 12A, 13A and 14A measure the magnetic field strength from this axis.

Figure 11:
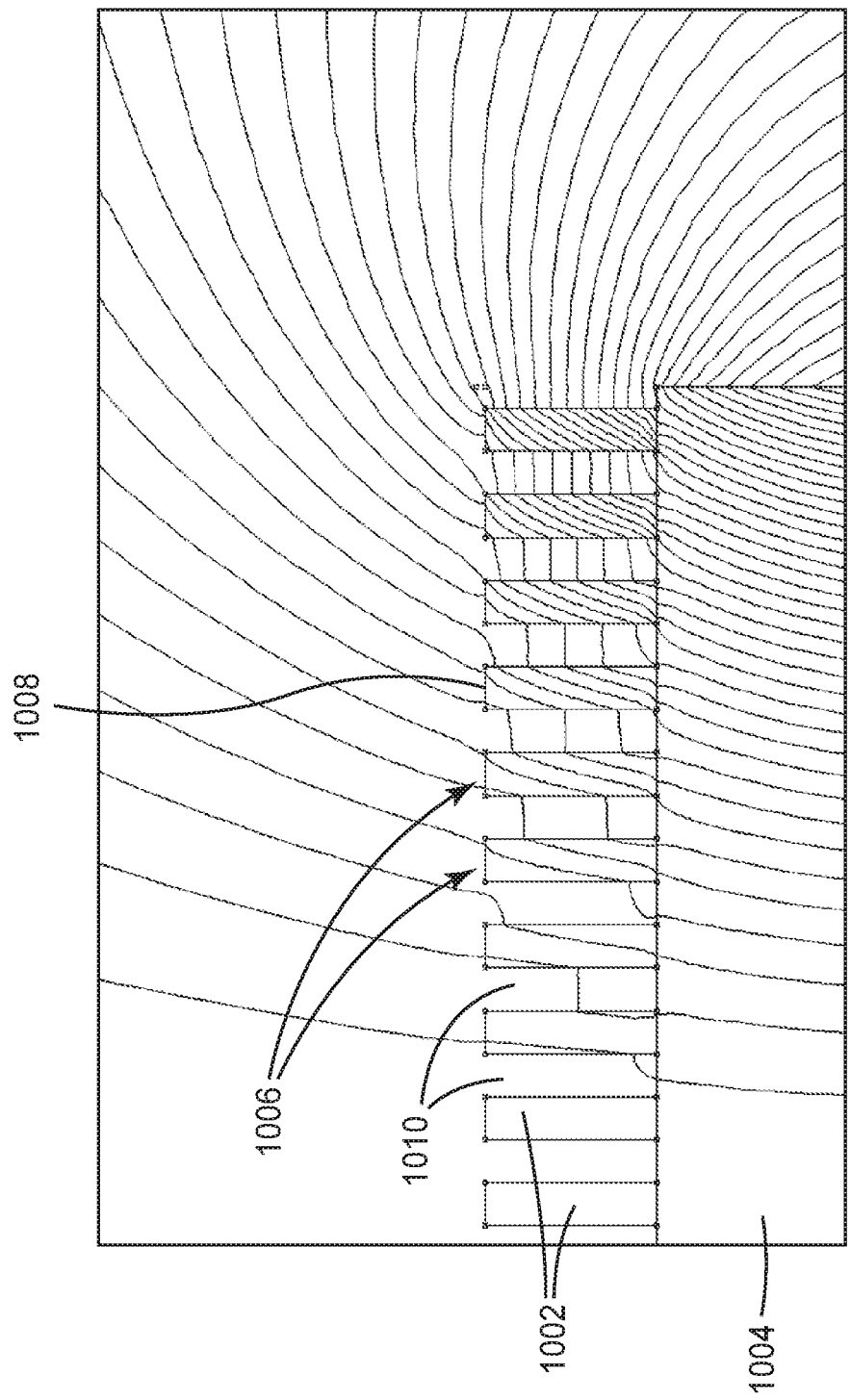
FIG. 11 shows a plot of the magnetic field that results for an apparatus comprised of iron shims disposed on a permanent magnet base according to an example of the present disclosure.
Figure 11A:
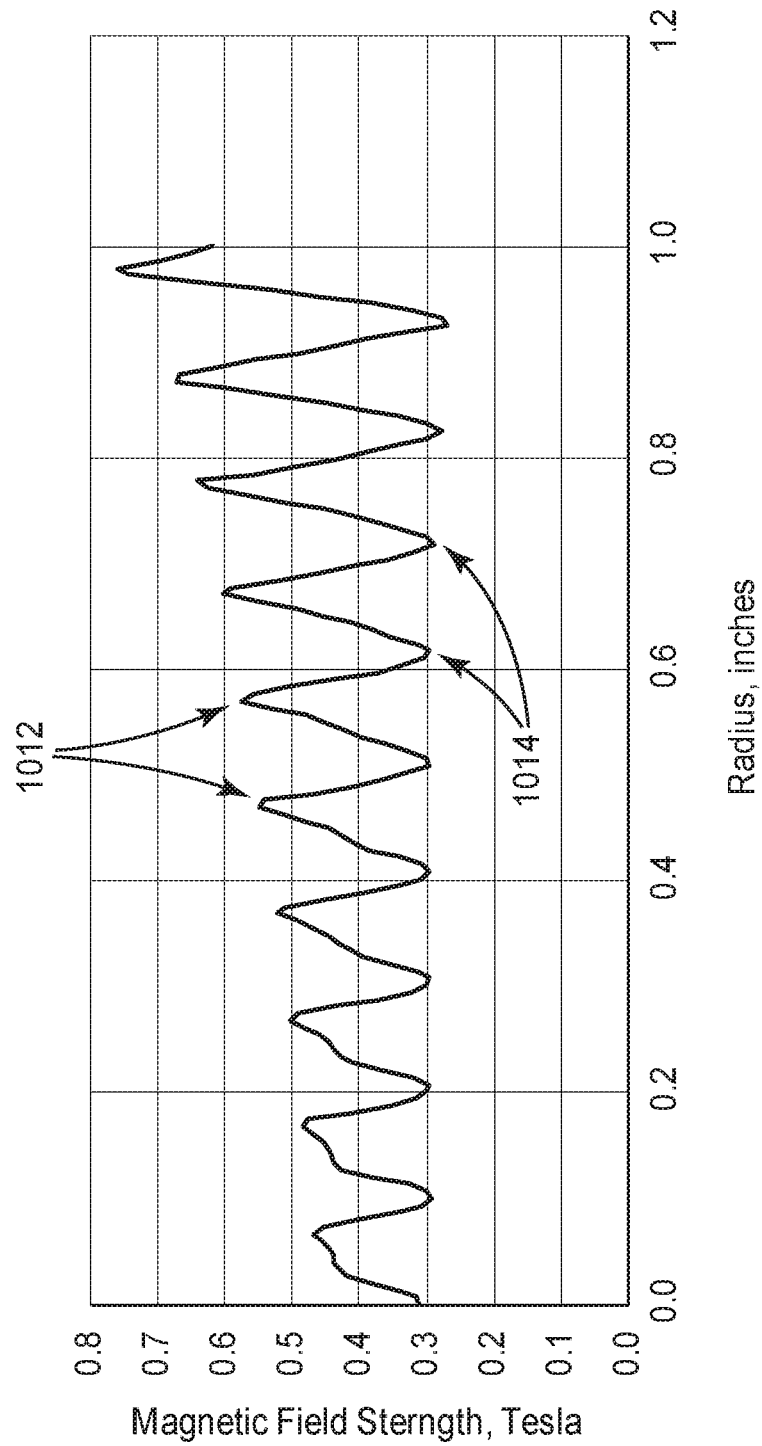
FIG. 11A shows a plot of magnetic field strength as measured extending out from an axis of symmetry of the apparatus, the magnetic field strength having a higher concentration in regions adjacent a tip of the iron shims and a relatively lower concentration in regions comprised of a non-magnetizable material according to an example of the present disclosure.

FIGS. 11 and 11A model an embodiment where circular iron shims are disposed on a permanent magnet base. FIG. 11 shows this arrangement with the iron shims 1002 and the permanent magnet 1004. As shown in FIG. 11, the magnetic flux lines become concentrated by the iron shims 1002 and remain concentrated in regions 1006 adjacent ends 1008 of the iron shims 1002. The iron shims 1002 are interposed with a non-magnetic material in regions 1010. FIG. 11A shows the strength of the magnetic field increases at the iron shims as exhibited by peaks 1012 of the plot. The strength of the magnetic field also decreases in the regions of the non-magnetic material as exhibited by valleys 1014 of the plot.

Figure 12:
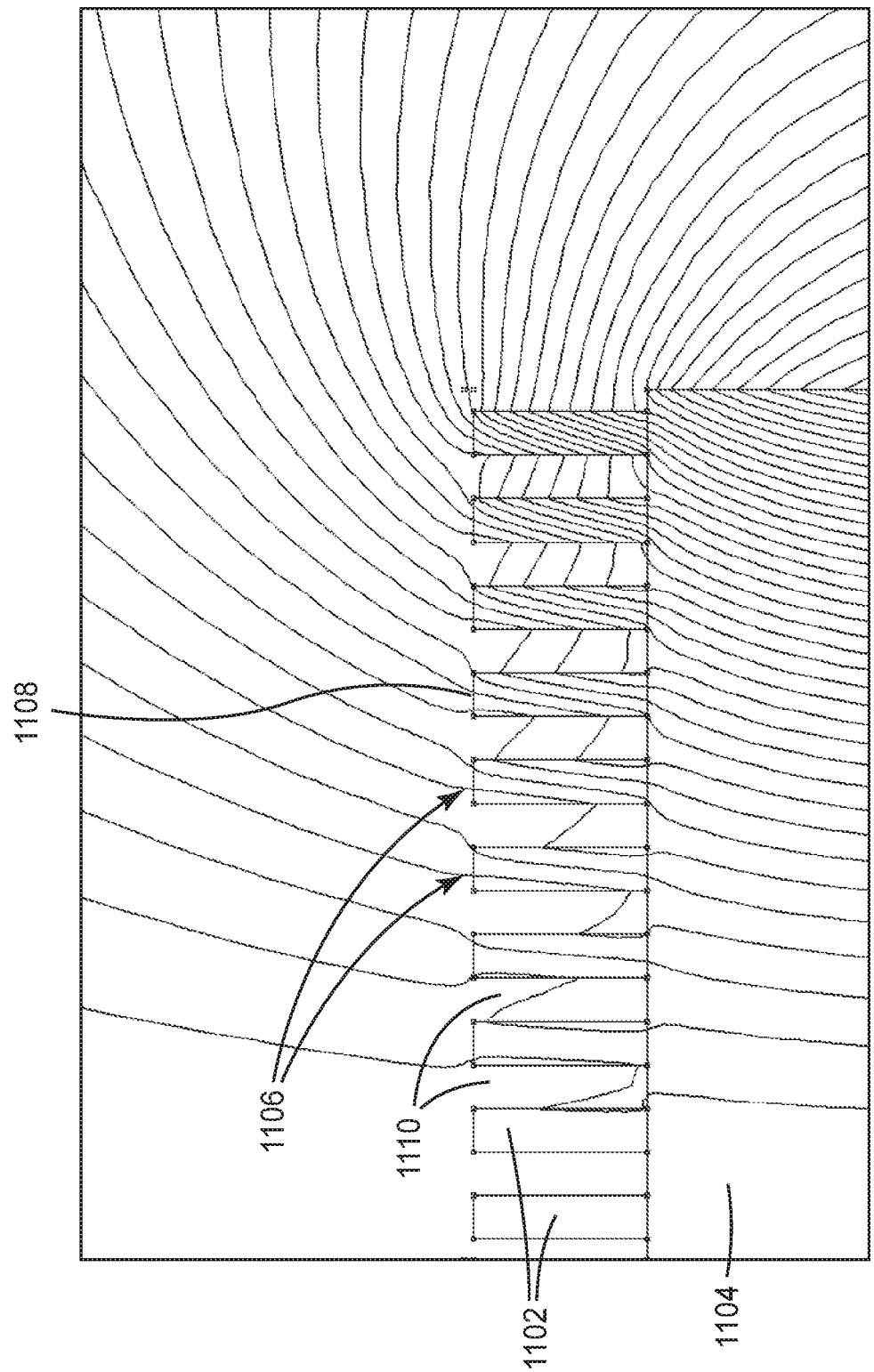
FIG. 12 shows a plot of the magnetic field that results for an apparatus comprised of a plurality of permanent magnets disposed on a permanent magnet base according to an example of the present disclosure.
Figure 12A:
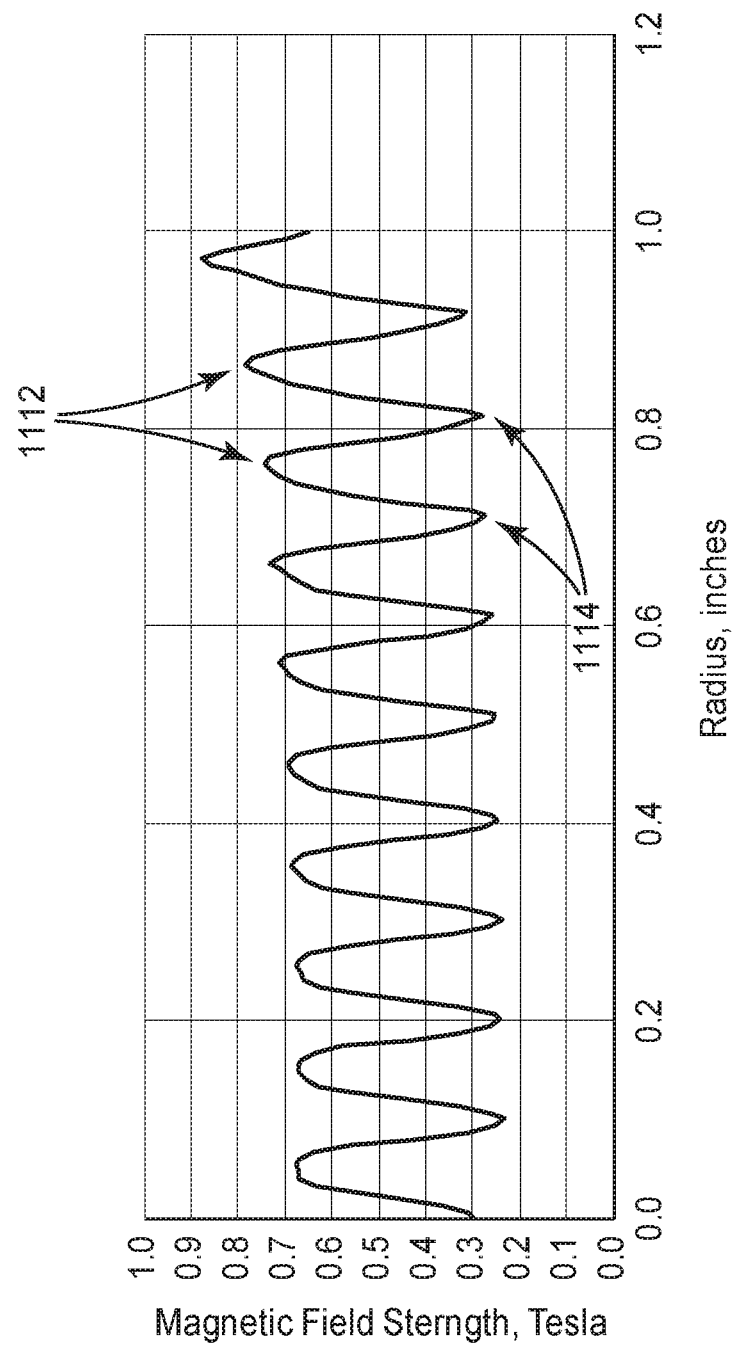
FIG. 12A shows a plot of magnetic field strength as measured extending out from an axis of symmetry of the apparatus, the magnetic field strength having a higher concentration in regions adjacent a tip of each of the plurality of permanent magnets and a relatively lower concentration in regions comprised of a non-magnetizable material according to an example of the present disclosure.

FIGS. 12 and 12A model an embodiment where a plurality of permanent magnets are disposed on a permanent magnet base. FIG. 12 shows this arrangement with the plurality of permanent magnets 1102 and the permanent magnet base 1104. As shown in FIG. 12, the magnetic flux lines are concentrated within and around the plurality of permanent magnets 1102 and remain concentrated in regions 1106 adjacent ends 1108 of the plurality of permanent magnets 1102. The plurality of permanent magnets 1102 are interposed with a non-magnetic material in regions 1110. FIG. 12A shows the strength of the magnetic field increases at the plurality of permanent magnets as exhibited by peaks 1112 of the plot. The strength of the magnetic field also decreases in the regions of the non-magnetic material as exhibited by valleys 1114 of the plot.

Figure 13:
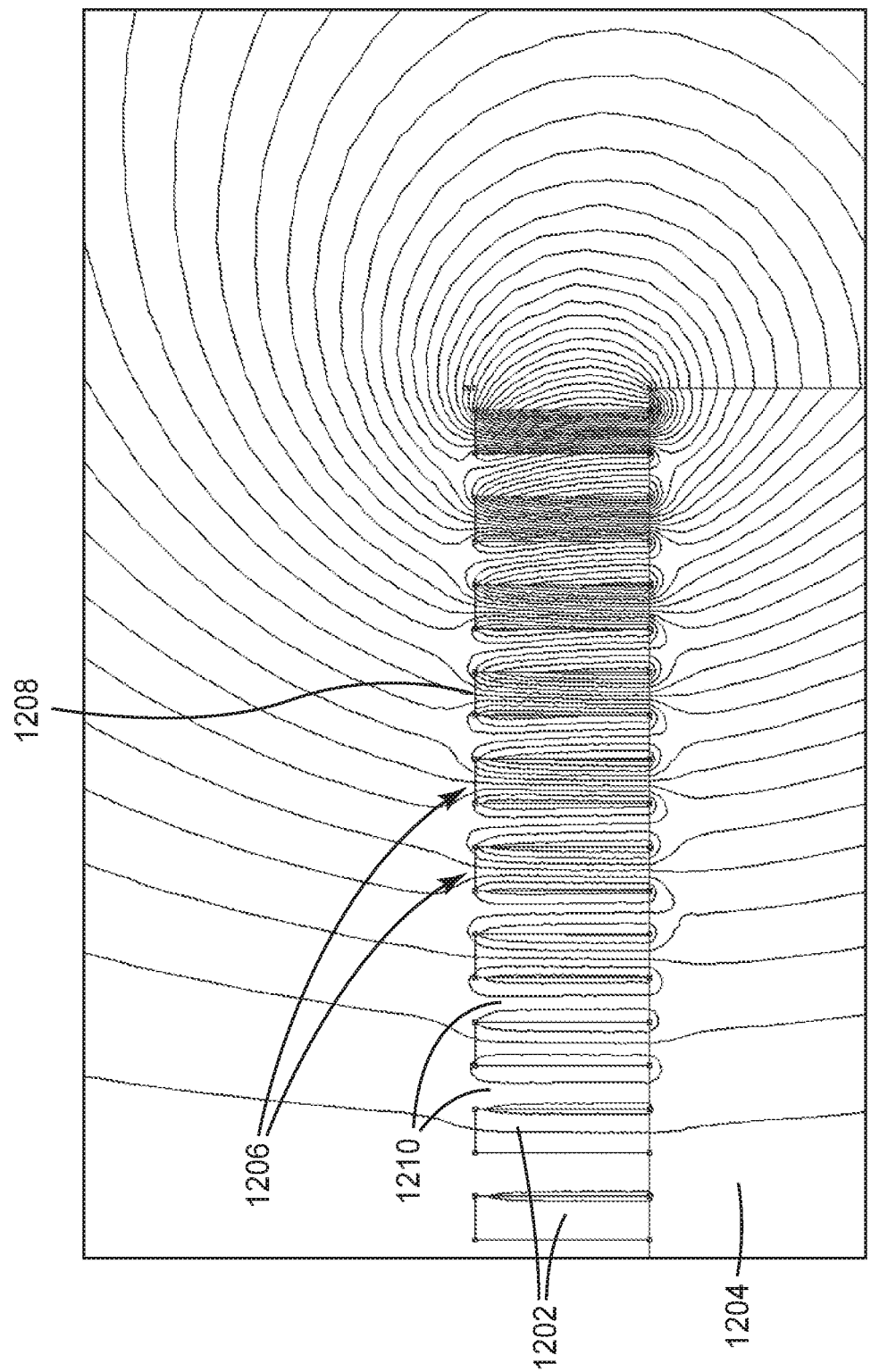
FIG. 13 shows a plot of the magnetic field that results for an apparatus comprised of a plurality of permanent magnets disposed on an iron base according to an example of the present disclosure.
Figure 13A:
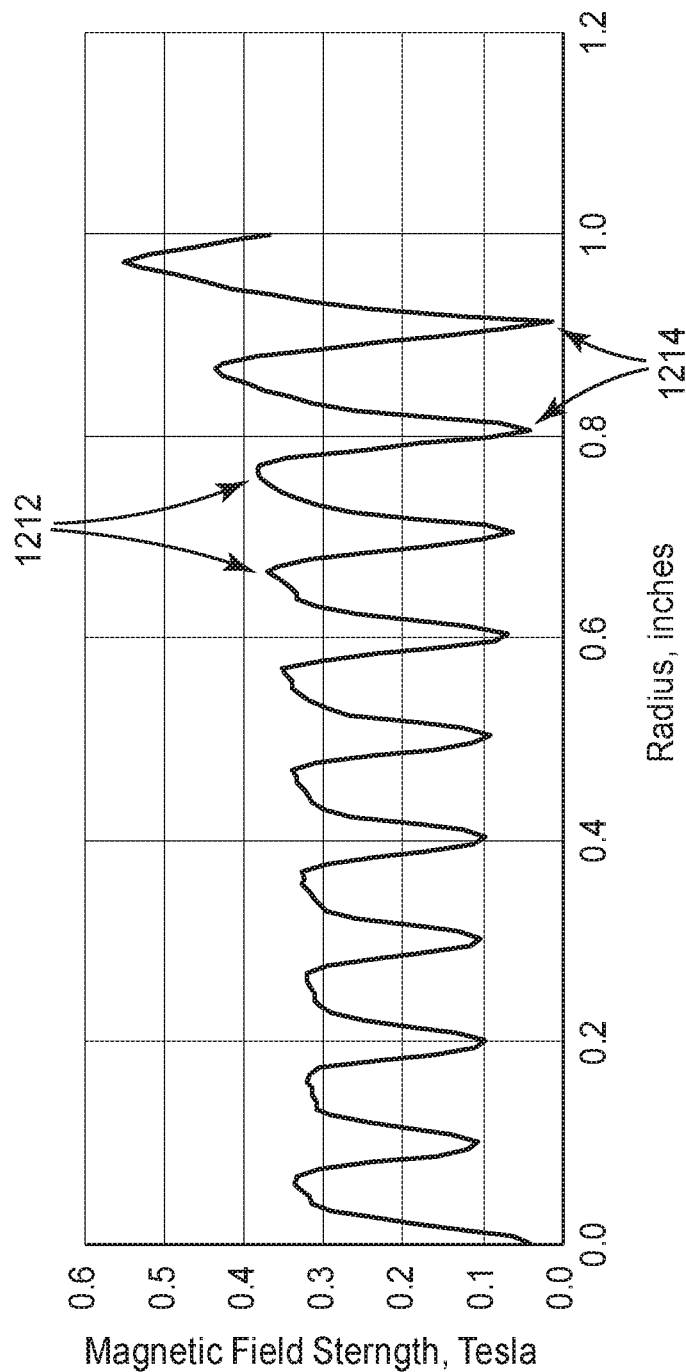
FIG. 13A shows a plot of magnetic field strength as measured extending out from an axis of symmetry of the apparatus, the magnetic field strength having a higher concentration in regions adjacent a tip of each of the plurality of permanent magnets and a relatively lower concentration in regions comprised of a non-magnetizable material according to an example of the present disclosure.

FIGS. 13 and 13A model an embodiment where a plurality of permanent magnets are disposed on an iron base. FIG. 13 shows this arrangement with the plurality of permanent magnets 1202 and the iron base 1204. As shown in FIG. 13, the magnetic flux lines are concentrated within and around the plurality of permanent magnets 1202 and remain concentrated in regions 1206 adjacent ends 1208 of the plurality of permanent magnets 1202. The plurality of permanent magnets 1202 are interposed with a non-magnetic material in regions 1210. FIG. 13A shows the strength of the magnetic field increases at the plurality of permanent magnets as exhibited by peaks 1212 of the plot. The strength of the magnetic field also decreases in the regions of the non-magnetic material regions as exhibited by valleys 1214 of the plot.

Figure 14:
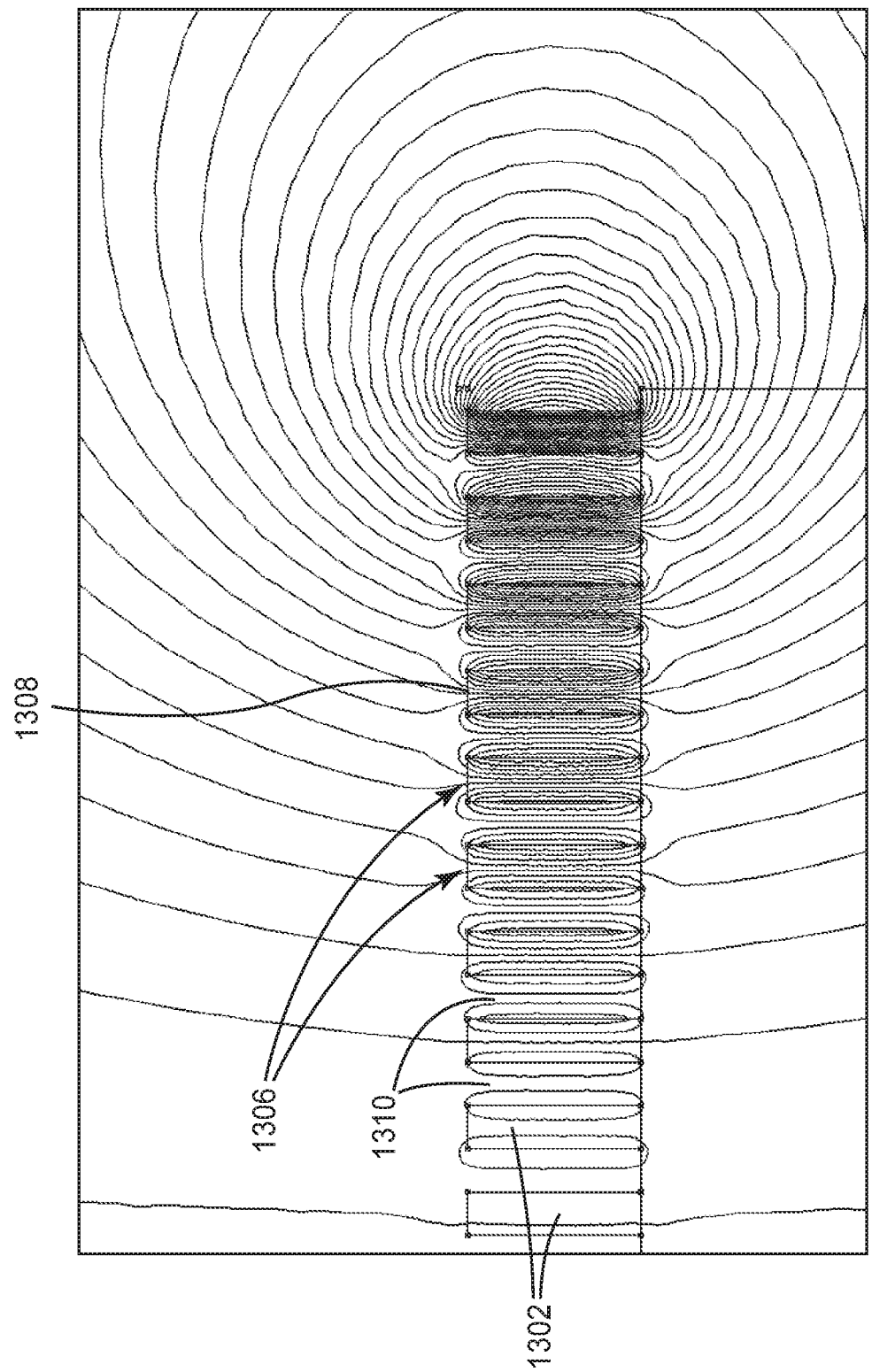
FIG. 14 shows a plot of the magnetic field that results for an apparatus comprised of a plurality of permanent magnets without a base according to an example of the present disclosure.
Figure 14A:
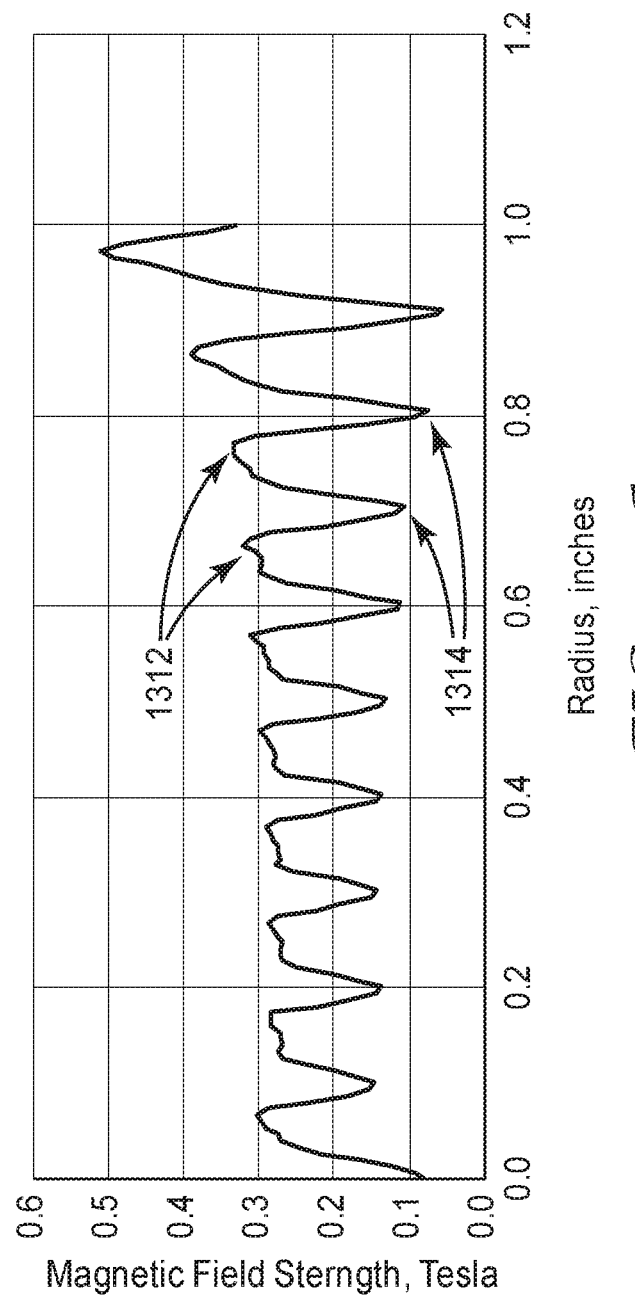
FIG. 14A shows a plot of magnetic field strength as measured extending out from an axis of symmetry of the apparatus, the magnetic field strength having a higher concentration in regions adjacent a tip of each of the plurality of permanent magnets and a relatively lower concentration in regions comprised of a non-magnetizable material according to an example of the present disclosure.

FIGS. 14 and 14A model an embodiment where a plurality of permanent magnets are used without a base. FIG. 14 shows this arrangement with the plurality of permanent magnets 1302. As shown in FIG. 14, the magnetic flux lines are concentrated within and around the plurality of permanent magnets 1302 and remain concentrated in regions 1306 adjacent ends 1308 of the plurality of permanent magnets 1302. The plurality of permanent magnets 1302 are interposed with a non-magnetic material in regions 1310. FIG. 14A shows the strength of the magnetic field increases at the plurality of permanent magnets as exhibited by peaks 1312 of the plot. The strength of the magnetic field also decreases in the regions of the non-magnetic material regions as exhibited by valleys 1314 of the plot.

Abrasive articles according to the present disclosure are useful for abrading a workpiece. Methods of abrading range from snagging (i.e., high pressure high stock removal) to polishing (e.g., polishing medical implants with coated abrasive belts), wherein the latter is typically done with finer grades of abrasive particles. One such method includes the step of frictionally contacting an abrasive article with a surface of the workpiece, and moving at least one of the abrasive article or the workpiece relative to the other to abrade at least a portion of the surface.

Examples of workpiece materials include metal, metal alloys, exotic metal alloys, ceramics, glass, wood, wood-like materials, composites, painted surfaces, plastics, reinforced plastics, stone, and/or combinations thereof. The workpiece may be flat or have a shape or contour associated with it. Exemplary workpieces include metal components, plastic components, particleboard, camshafts, crankshafts, furniture, and turbine blades. The applied force during abrading typically ranges from about 1 kilogram to about 100 kilograms.

Abrasive articles according to the present disclosure may be used by hand and/or used in combination with a machine. At least one of the abrasive article and the workpiece is moved relative to the other when abrading. Abrading may be conducted under wet or dry conditions. Exemplary liquids for wet abrading include water, water containing conventional rust inhibiting compounds, lubricant, oil, soap, and cutting fluid. The liquid may also contain defoamers, degreasers, for example.

The following embodiments are intended to be illustrative of the present disclosure and not limiting.

Various Notes & Examples

Example 1 is a method of making an abrasive article, the method can comprise: providing a tool that has a first portion that comprises a first material and a second portion that comprises a second material, wherein the second material differs from the first material and the tool is subject to a magnetic field, and wherein the first material and the second material are provided such that the magnetic field is relatively stronger at and adjacent the first portion relative to the magnetic field at and adjacent the second portion; positioning a surface adjacent to the tool so as to be subject to the magnetic field; and disposing magnetizable abrasive particles on the surface, wherein the magnetizable abrasive particles are attracted to an area on the surface adjacent the first portion where the magnetic field is relatively stronger so as to provide for at least one of a desired orientation, placement and alignment of a majority of the magnetizable abrasive particles on the surface.

In Example 2, the subject matter of Example 1 optionally can include the first material comprises a magnetizable material and the second material comprises a non-magnetizable material.

In Example 3, the subject matter of Examples 1 optionally can include the first material comprises a magnet and the second material comprises a non-magnetizable material.

In Example 4, the subject matter of any one or more of Examples 1-3 optionally can include vibrating one or more of the surface, the magnetizable abrasive particles and the tool to enhance at least one of the alignment and the orientation of the magnetizable abrasive particles on the backing.

In Example 5, the subject matter of any one or more of Examples 1-4 optionally can include one of the surface and the tool is translated relative to the other of the surface and the tool, and the method is part of a continuous process.

In Example 6, the subject matter of any one or more of Examples 1-5 optionally can include the method is part of a batch process.

In Example 7, the subject matter of any one or more of Examples 1-6 optionally can include wherein the abrasive article comprises a coated article and the surface comprises a first major surface of a backing, the method further comprising: providing a layer of a first curable binder precursor disposed on at least a portion of the first major surface; orienting the backing such that the first major surface is closer to the tool than the second major surface; contacting magnetizable abrasive particles with the layer of the first curable binder precursor; and at least partially curing the layer of the first curable binder precursor to provide an at least partially cured abrasive layer secured to the backing.

In Example 8, the subject matter of Example 7 optionally can include disposing a layer of a second curable binder precursor onto at least a portion of the at least partially cured abrasive layer, and at least partially curing the second curable binder precursor.

In Example 9, the subject matter of any one or more of Examples 1-8 optionally include wherein the tool comprises at least one of a permanent magnet and an electromagnet at the first portion or a magnetizable material at the first portion and the second portion comprises a non-magnetizable material, and wherein the first portion and the second portion are arranged in a predetermined pattern.

In Example 10, the subject matter of Example 9 optionally can include wherein the predetermined pattern is discontinuous in at least one of a cross-web and a down-web direction on the surface.

In Example 11, the subject matter of any one or more of Examples 9-10 optionally can include wherein the predetermined pattern is discontinuous such that the first portion comprises a plurality of regions that are spaced apart from one another by the second portion.

In Example 12, the subject matter of any one or more of Examples 1-11 optionally can include wherein the surface comprises a backing and a first major surface of the backing has ridges and grooves therein, and wherein a majority of the magnetizable abrasive particles are partially disposed within and aligned with the grooves between the ridges.

In Example 13, the subject matter of any one or more of Examples 1-12 optionally can include wherein the surface comprises a portion of a mold, the abrasive article comprises a bonded article and the method, further comprises: disposing a layer of a first curable composition into a circular cavity of a mold, wherein the mold has an outer circumference and a rotational axis extending therethrough, and wherein the curable composition comprises the magnetizable abrasive particles dispersed in a first organic binder precursor; disposing a first porous reinforcing material onto the layer of first curable composition; disposing a layer of a second curable composition onto the porous reinforcing material and first curable composition, wherein the second curable composition comprises the magnetizable abrasive particles dispersed in a second organic binder precursor; wherein the applying of the magnetic field to the curable composition orients a majority of the magnetizable abrasive particles substantially parallel to the rotational axis; and at least partially curing the curable composition to provide the bonded abrasive wheel.

In Example 14, the subject matter of Example 13 optionally can include wherein sequent to disposing the layer of the first curable composition a second porous reinforcing material is placed in the circular mold cavity, and wherein the layer of the first curable composition is disposed on the second reinforcing material.

Example 15 is a system for producing an abrasive article the system can comprise: a magnet; a tool having a first portion comprised of a magnetizable material and second portions comprised of a non-magnetizable material, the magnet subjecting the tool to a magnetic field such that both the first portion and the second portion are subject to the magnetic field, wherein the magnetic field is concentrated at the first portion relative to the second portion; a backing; and magnetizable abrasive particles configured to be attracted to one or more areas on the backing at or adjacent where the magnetic field is concentrated when the tool is positioned adjacent the backing and magnet so as to be subject to the magnetic field, whereby the concentrated magnetic field provides for at least one of a desired orientation, placement and alignment of the magnetizable abrasive particles on the backing.

In Example 16, the subject matter of Example 15 optionally can include wherein the first portion and the second portion are arranged in a predetermined pattern.

In Example 17, the subject matter of any one or more of Examples 15-16 optionally can include wherein the tool is disc shaped and the magnetic field is concentrated to provide for a pattern to at least one of the alignment and placement of the magnetizable abrasive particles.

In Example 18, the subject matter of any one or more of Examples 15-17 optionally can include wherein each of the plurality of magnetizable abrasive particles comprise a shaped ceramic body having a surface with a magnetizable layer disposed on at least a portion thereof.

In Example 19, the subject matter of any one or more of Examples 15-18 optionally can include wherein the first portion is discontinuous and comprises a plurality of traces spaced from one another by the second portion.

In Example 20, the subject matter of any one or more of Examples 15-19 optionally can include wherein the second portion further comprises recesses in the tool.

In Example 21, the subject matter of any one or more of Examples 15-20 optionally can include wherein a first major surface of the backing has ridges and grooves therein, and wherein a majority of the magnetizable abrasive particles are partially disposed within and aligned with the grooves between the ridges.

In Example 22, the subject matter of any one or more of Examples 15-21 optionally can include a mechanism configured to vibrate one or more of the backing, the magnetizable abrasive particles and the tool to enhance alignment of the magnetizable abrasive particles on the backing.

Example 23 is a coated abrasive article that can comprise: a backing having first and second opposed major surfaces; and an abrasive layer disposed on the first major surface of the backing, wherein the abrasive layer comprises a first binder material and magnetizable abrasive particles, wherein the magnetizable abrasive particles are arranged according to a predetermined pattern as a result of a concentrated magnetic field being applied to the abrasive layer and backing prior to curing.

In Example 24, the subject matter of Example 23 optionally can include wherein the magnetizable abrasive particles have a major planar surface that forms an angle of at least 70 degrees with respect to the backing.

In Example 25, the subject matter of any one or more of Examples 23-24 optionally can include wherein the abrasive layer further comprise a second binder material disposed over the first binder material and the magnetizable abrasive particles.

In Example 26, the subject matter of any one or more of Examples 23-25 optionally can include wherein the first major surface of the backing has grooves therein, and wherein a majority of the magnetizable abrasive particles are partially disposed within and aligned with the grooves.

In Example 27, the subject matter of any one or more of Examples 23-26 optionally can include mechanism configured to vibrate one or more of the backing, the magnetizable abrasive particles and the tool to enhance alignment of the magnetizable abrasive particles on the backing.

Example 28 is a bonded abrasive article that can comprise: a first curable composition that comprises a filler abrasive particles dispersed in a first organic binder precursor; a first porous reinforcing material disposed on the first curable composition; and a second curable composition disposed on the porous reinforcing material and first curable composition, wherein the second curable composition comprises magnetizable abrasive particles dispersed in a second organic binder precursor; wherein the magnetizable abrasive particles are arranged according to a predetermined pattern as a result of a concentrated magnetic field being applied to the bonded abrasive article prior to curing.

Example 29 is a method of making an abrasive article, the method can comprise: providing a tool that has one or more first portions of a magnetizable material and one or more second portions of a non-magnetizable material; applying a magnetic field to the tool such that both the first portions and the second portions are subject to the magnetic field, wherein the magnetic field is concentrated at and adjacent the first portions relative to the second portions; positioning a backing adjacent to the tool so as to be subject to the magnetic field; and disposing magnetizable abrasive particles on the backing, wherein the magnetizable abrasive particles are attracted to one or more areas on the backing where the magnetic field is concentrated so as to provide for at least one of a desired orientation, placement and alignment of the magnetizable abrasive particles on the backing.

Example 30 is a nonwoven abrasive article that can comprise: a nonwoven backing having first and second opposed major surfaces; and an abrasive layer disposed on the first major surface of the backing, wherein the abrasive layer comprises a first binder material and magnetizable abrasive particles, wherein the magnetizable abrasive particles are arranged according to a predetermined pattern as a result of a concentrated magnetic field being applied to the abrasive layer and backing prior to curing.

WORKING EXAMPLES

Unless otherwise noted, all parts, percentages, ratios, etc. in the Examples and the rest of the specification are by weight. Unless stated otherwise, all other reagents were obtained, or are available from fine chemical vendors such as Sigma-Aldrich Company, St. Louis, Missouri, or may be synthesized by known methods.

Material abbreviations used in the Examples are described in Table 1, below.

Unit Abbreviations used in the Examples:
° C.: degrees Centigrade
cm: centimeter
g/m$^2$: grams per square meter
mm: millimeter Material abbreviations used in the Examples are described in Table 1, below.

TABLE 1

| ABBRE-VIATION | DESCRIPTION |
|---|---|
| PR | Resole phenolic resin, a 1.5:1 to 2.1:1 (phenol:formaldehyde) condensate catalyzed by 2.5% potassium hydroxide, obtained as GP 8339 R-23155B from Georgia Pacific Chemicals, Atlanta, Georgia. |
| PME | Propylene glycol methyl ether, obtained as "DOWANOL PM" from DOW Chemical Company, Midland, Michigan. |
| SAP | Shaped abrasive particles were prepared according to the disclosure of U.S. Pat. No. 8,142,531 (Adefris et al). The shaped abrasive particles were prepared by molding alumina sol gel in equilateral triangle-shaped polypropylene mold cavities. After drying and firing, the resulting shaped abrasive particles were about 1.4 mm (side length) × 0.35 mm (thickness), with a draft angle approximately 98 degrees. |
| TOOL | A tooling having vertically-oriented triangular cavities generally described in patent publication WO2015/100220 and configured as shown in FIGS. 3A-3C in WO2015/100220, wherein length = 1.875 mm, width = 0.785 mm, depth = 1.62 mm, bottom width = 0.328 mm) arranged in a rectangular array (length-wise pitch = 1.978 mm, width-wise pitch = 0.886 mm) with all long dimensions in the same direction. |
| AO | grade 24 aluminum oxide abrasive particles available as 24 BFRPL from Treibacher Schleifmettel AG, Villach, Austria. |
| PAF | potassium fluoroaluminate, particle size distribution $d_{10}$ = 2.58 micrometers, $d_{50}$ = 11.5 micrometers, $d_{90}$ = 36.6 micrometers, from KBM Afflips B.V., Oss, The Netherlands. |
| PRL | liquid phenolic resin, available as DYNEA 5136G from Dynea Oy Corporation, Helsinki, Finland. |
| PRP | phenolic resin powder, available as VARCUM 29302 from Durez Corporation, Dallas, Texas. |
| PMIX | 50:50 blend of PAF and PRP mixed in a V-blender for 3 hours. |
| SCRIM1 | fiberglass mesh obtained as STYLE 4400 from Industrial Polymer and Chemicals, Inc., Shrewsbury, Massachusetts. |
| SCRIM2 | fiberglass mesh from Tissa Glasweberei AG, Oberkulm, Switzerland. |

Preparation of Magnetizable Abrasive Particles (MAP1)

SAP was coated with 304 stainless steel using physical vapor deposition with magnetron sputtering, 304 stainless steel sputter target, described by Barbee et al. in Thin Solid Films, 1979, vol. 63, pp. 143-150, deposited as the magnetic ferritic body centered cubic form. The apparatus used for the preparation of 304 stainless steel film coated abrasive particles (i.e., magnetizable abrasive particles) was disclosed in U.S. Pat. No. 8,698,394 (McCutcheon et al.). 1631 grams of SAP were placed in a particle agitator that was disclosed in U.S. Pat. No. 7,727,931 (Brey et al, Column 13, line 60). The physical vapor deposition was carried out for 10 hours at 5.0 kilowatt at an argon sputtering gas pressure of 10 millitorr (1.33 pascal) onto SAP. The density of the coated SAP was 3.9876 grams per cubic centimeter (the density of the uncoated SAP was 3.9013 grams per cubic centimeter). The weight percentage of metal coating in the MAP1 coated abrasive particles was 2.2 wt. %.

Preparation of Mixes

Mixes were prepared according to the composition listed in Table 2. Each mix was prepared by first mixing AO or MAP1 with PRL for 7 minutes in a paddle mixer, then the PMIX powder blend was added and mixed for 7 additional minutes.

TABLE 2

| Component | Amount, grams | |
|---|---|---|
| | MIX1 | MIX2 |
| AO | 720 | — |
| MAP1 | — | 720 |
| PMIX | 225 | 225 |
| PRL | 55 | 55 |

Example 1

Figure 15:
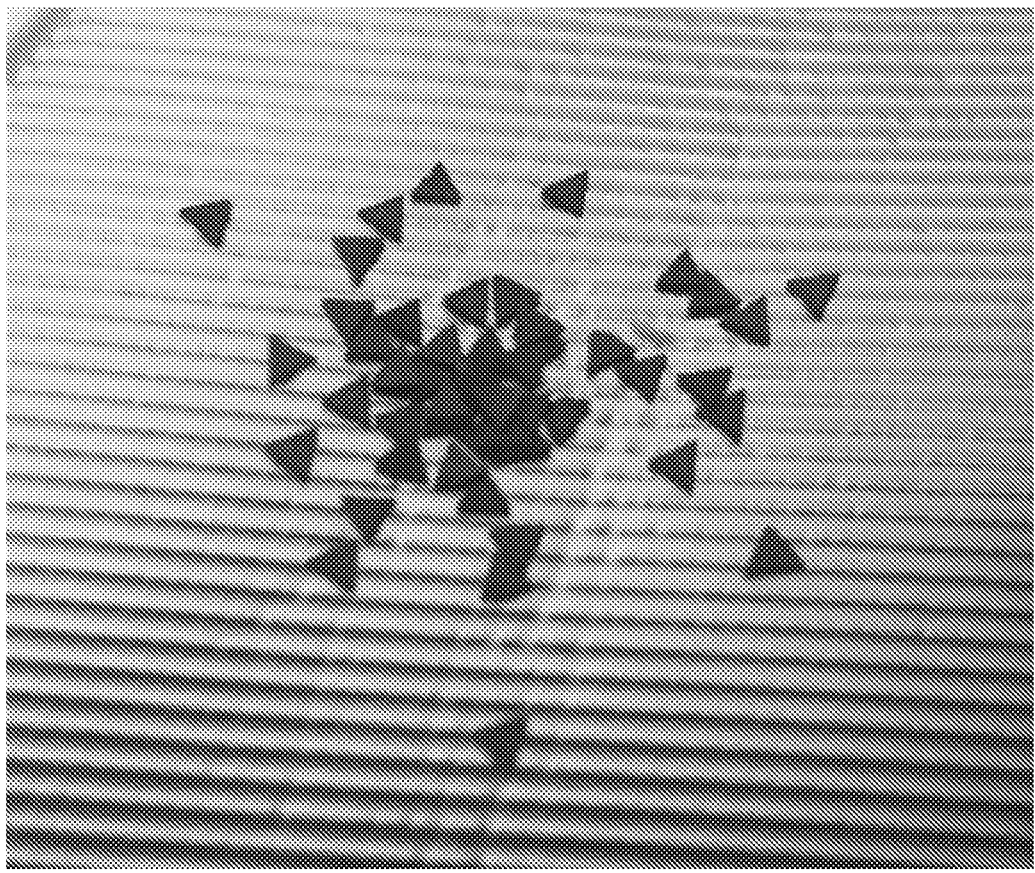
FIG. 15 is a digital image of a shaped aluminum surface having ridges and grooves with a plurality of the magnetizable abrasive particles disposed on the surface prior to the application of a magnetic field in accordance with Example 1.
Figure 16:
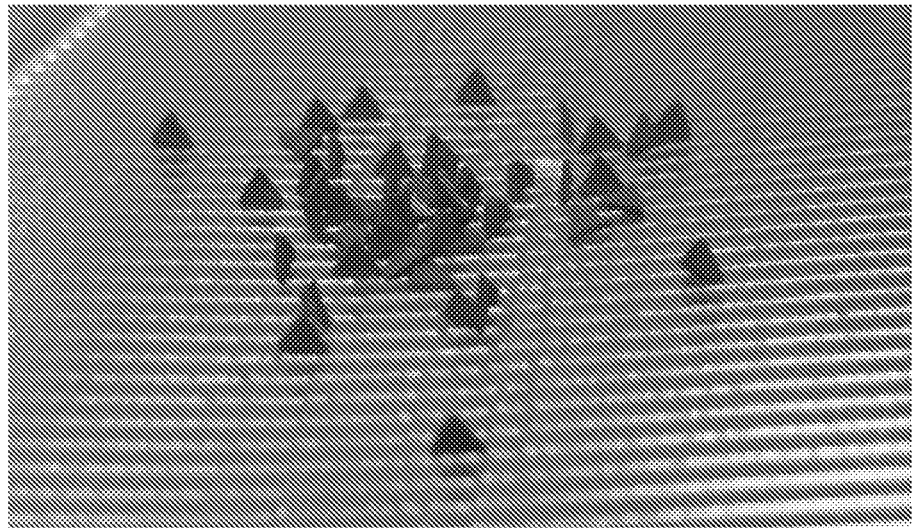
FIG. 16 is a digital image of the surface having ridges and grooves with a plurality of the magnetizable abrasive particles disposed on the surface after the application of a magnetic field in accordance with Example 1.
Figure 17:
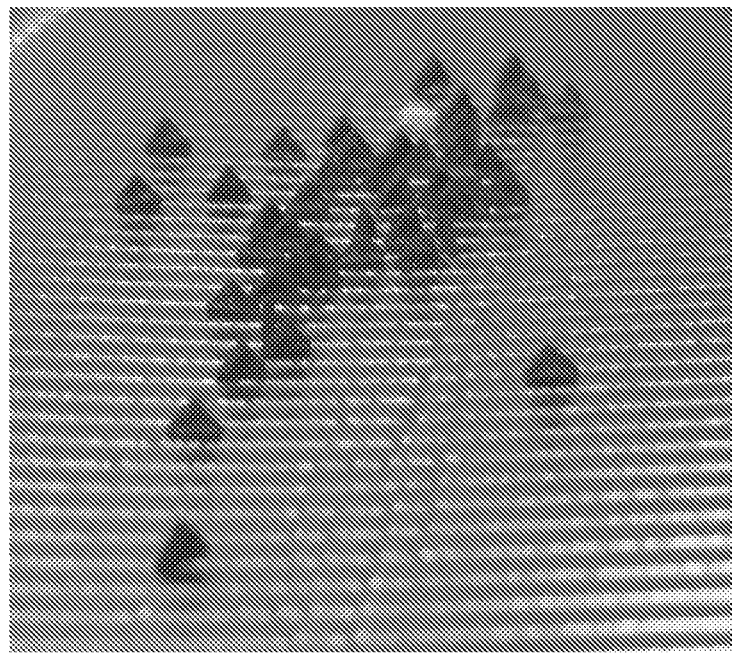
FIG. 17 is a digital image of the surface having ridges and grooves with a plurality of the magnetizable abrasive particles disposed on the surface after the application of a magnetic field and vibration of the surface and the magnetizable abrasive particles in accordance with Example 1.

An aluminum sheet having shallow grooves about 50 um deep, with a pitch of about 650 um was utilized. About 0.04 grams of MAP1 were dropped onto the surface of this aluminum sheet. The SAP particles came to rest randomly on the sheet as shown in FIG. 15. Then the sheet with SAP particles was placed about 2" above the large face of a 3"×3"×0.5" N52 neodymium magnet, which caused many of the SAP particles to take on an orientation normal to a surface of the sheet as shown in FIG. 16. Some degree of random alignment was still observed. Then the aluminum sheet was lightly vibrated resulting in further alignment of the SAP particles with the shallow grooves in the aluminum sheet and reorientation of the SAP particles was observed as shown in FIG. 17.

Example 2

An experiment was done with a tooling containing multiple carbon steel shims. Such tooling is generally described in U.S. Provisional Patent Application Ser. No. 62/182,077, and was generated by 3D printing. The tooling had dimensions of 1.5 inches (3.81 cm)×1 inch (2.54 cm)×0.5 inch (1.27 cm). Each ferromagnetic shim was 0.020-inch (0.51-mm) thick, 1-inch (2.54-cm) high, and the gap between each shim was 0.051 inch (1.3 mm). Design images of the shims and the tooling has been described previously in regards to the slot examples of FIGS. 3-4A.

Figure 18A:
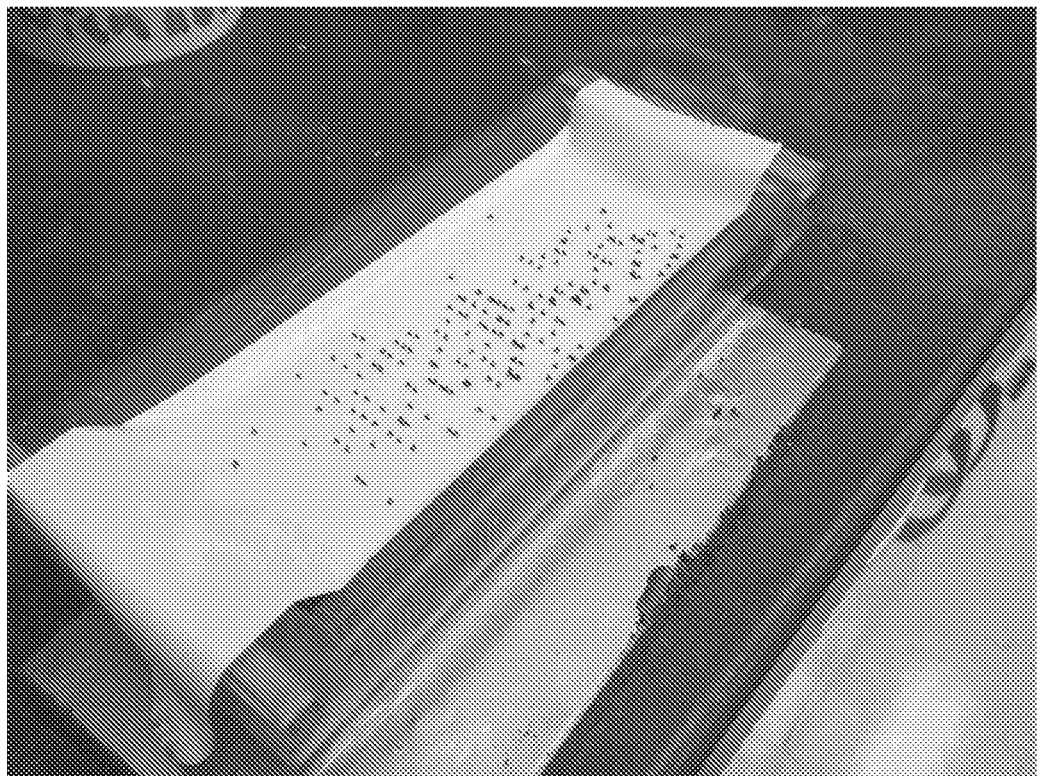
FIGS. 18A and 18B are digital images of magnetic abrasive particles disposed on a web above an apparatus comprised of a permanent magnet and a plurality of magnetizable shims, the magnetic abrasive particles attract to and obtain a spacing of magnetizable shims and also aligned in a same direction as the magnetizable shims in accordance with Example 2.
Figure 18B:
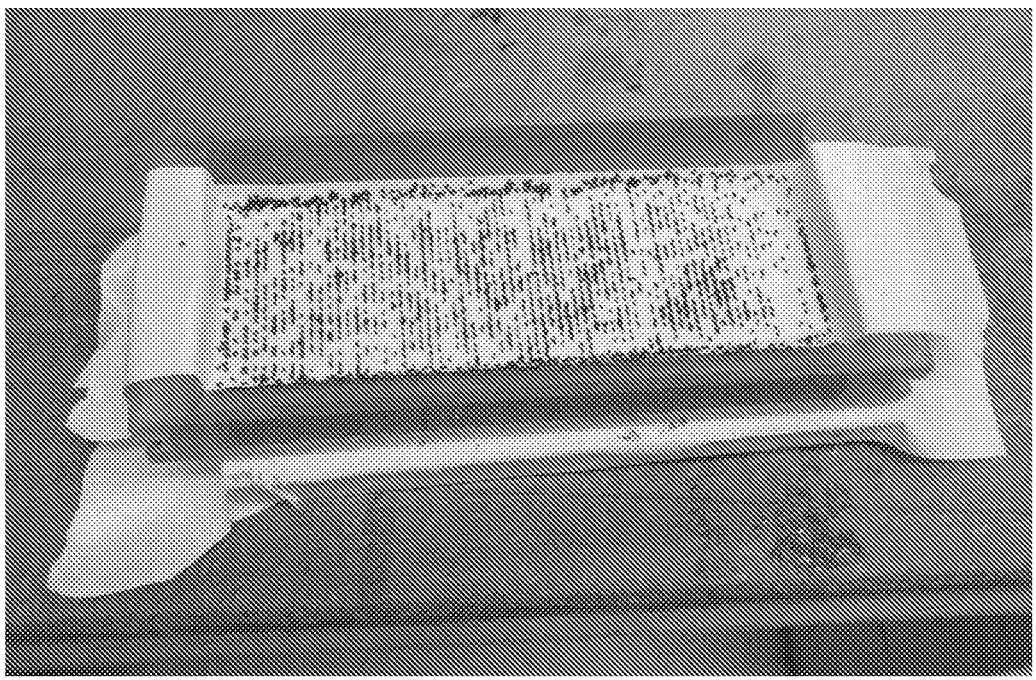

This tooling was placed directly on top of a 3"×6"×0.5" neodymium magnet. A 5 mil thick piece of vinyl tape was adhered on top of the tooling to provide a surface for the particles to rest. The non-sticky side was facing up away from the tooling. Then, 2.0 grams of MAP1 particles were deposited onto the surface. The MAP1 particles demonstrated a tendency to attract to the spacing of magnetizable shims, and also aligned in a same direction as the magnetizable shims as shown in FIGS. 18A and 18B. Additionally, the MAP1 particles exhibited a tendency to space themselves out and not bunch up too excessively.

Example 3

Precision spaced magnetizable shims were placed on top of a Neodymium magnet. The Magnet was 8" in diameter and 2" thick Grade N52. The magnet was assembled on top of a 10" diameter×1" thick steel plate to concentrate the field lines. The precision spaced magnetizable shims were 0.025" thick, 1.5 inches long, and 0.1" tall. Between each of these as well as on the ends, non-magnetizable plastic shims (0.075" wide×1.5" long×0.1" tall) were placed to control the space between the magnetizable shims. A standard J-Weight coated backing was placed on top of the precision spaced shims. The top side of this backing was coated with a liquid phenolic resin mix with a coat weight of 278 grains/4×6. The liquid resin mix was composed of 2 parts liquid phenolic resin to 1 part PME solvent and was mixed thoroughly by hand for 1 minute. The arrangement of EXAMPLE 3 is generally shown and described in reference to FIG. 2.

Figure 19:
FIG. 19 is a digital image of an abrasive article with magnetizable abrasive particles oriented and aligned according to the process described in Example 3.

Then, 36+ triangle shaped SAP particles were sprinkled onto the resin coating at a coat weight of 1.2 grains/24 in$^2$. Immediately after applying the abrasive grain, the SAP particles oriented themselves along the shim pattern and also oriented their longest face in the same direction of the length of the shims. A 250 Watt IR heat lamp was placed at 12" above the sample. This cured the resin after 10 minutes. Then, the sample was removed from the magnetic field and all of the particles remained in the intended shim pattern spacing and also retained their rotational alignment in the direction where the length of the shims had been as shown in FIG. 19.

Example 4

Tooling comprising 3D printed pattern was placed over a 3"×6"×0.5" neodymium magnet. A web interposed between the magnet and the tooling. The 3D printed pattern had a construction similar to that of the embodiment discussed in FIG. 2. The 3D printed pattern (sometimes referred to as a tool herein) was filled with magnetite filings to fill voids. The printed pattern had a disc structure with the surface having rectangular sections of magnetite patterned in a annular fashion, and the remaining parts of the material being made up of the 3D printed polymer. MAP1 particles were deposited onto a surface of the web above the printed pattern. The MAP1 particles demonstrated a tendency to attract to the spacing of the magnetite filings and were not attracted to areas of the above the non-magnetizable material (the 3D printed polymer).

Example 5

An experiment was done with a tooling containing multiple carbon steel shims. Such tooling is generally described in U.S. Provisional Patent Application Ser. No. 62/182,077, and was generated by 3D printing. The tooling had dimensions of 1.5 inches (3.81 cm)×1 inch (2.54 cm)×0.5 inch (1.27 cm). Each ferromagnetic shim was 0.020-inch (0.51-mm) thick, 1-inch (2.54-cm) high, and the gap between each shim was 0.051 inch (1.3 mm). Design images of the shims and the tooling has been described previously in regards to the slot examples of FIGS. 3-4A.

This tooling was placed over a 3"×6"×0.5" neodymium magnet. The experiment of EXAMPLE 5 suggested putting the assembly of the magnet, ferrous printed pattern, and the coated web on a vibrating stand could achieve greater degrees of orientation and alignment for the MAP1 particles. The vibrational force gave some degree of freedom to MAP1 particles to overcome the adhesive force on the web and to precisely orient and align themselves with the ferrous shims.

In particular, a 11 mil layer of phenolic resin was knife coated by hand on the non-sticky side of a piece of tape. Table 2 shows the ingredients and their contents in the utilized phenolic resin.

TABLE 3

Ingredients and their contents in the utilized phenolic resin

| 3M ID# | DESCRIPTION | actual amount (lbs) | actual wt % in mix | solids content |
|---|---|---|---|---|
| 11-0011-0279-4 | Phenolic BB077 | 8.5 | 0.42 | 5.95 |
| 11-0002-8488-2 | PME | 0.17 | 0.01 | 0 |
| 11-0011-2232-1 | SR-511A HYDROXY ETHYL ETHYLENE UREA | 0.35 | 0.02 | 0.2625 |
| 41-1700-0776-3 | Laponite Premix | 10.2 | 0.51 | 0.1785 |
| 11-0029-2825-4 | Dynal 604 | 0.064 | 0.00 | 0.064 |
| 11-0021-3311-1 | Hubercarb Q325 Calcium Carbonate | 0.577 | 0.03 | 0.577 |
| 11-0000-2623-4 | Cabosil | 0.270 | 0.01 | 0.27 |
| | Total | 20.1 | | 7.30 |
| | wt % solids | 0.36 | | |
| | viscosity (#3, 30 rpm, warm) | 880 | | |

Figure 20:
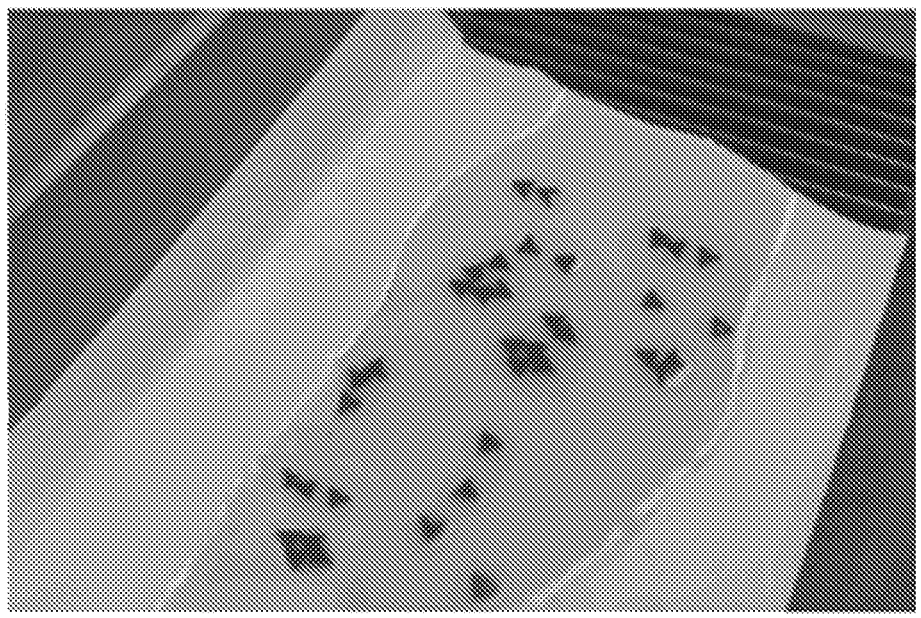
FIG. 20 is a digital image of magnetizable abrasive particles in phenolic resin prior to a backing, a tool and the magnetizable abrasive articles being vibrated in accordance with Example 5.

In the first experiment, a piece of the tape was adhered onto the top of the tooling such that the phenolic coating layer was on the top on the tape. Then, MAP1 particles were deposited onto tape surface. All the MAP1 particles laid down on the phenolic coating upon reaching to the coated web as shown in FIG. 20.

Figure 21:
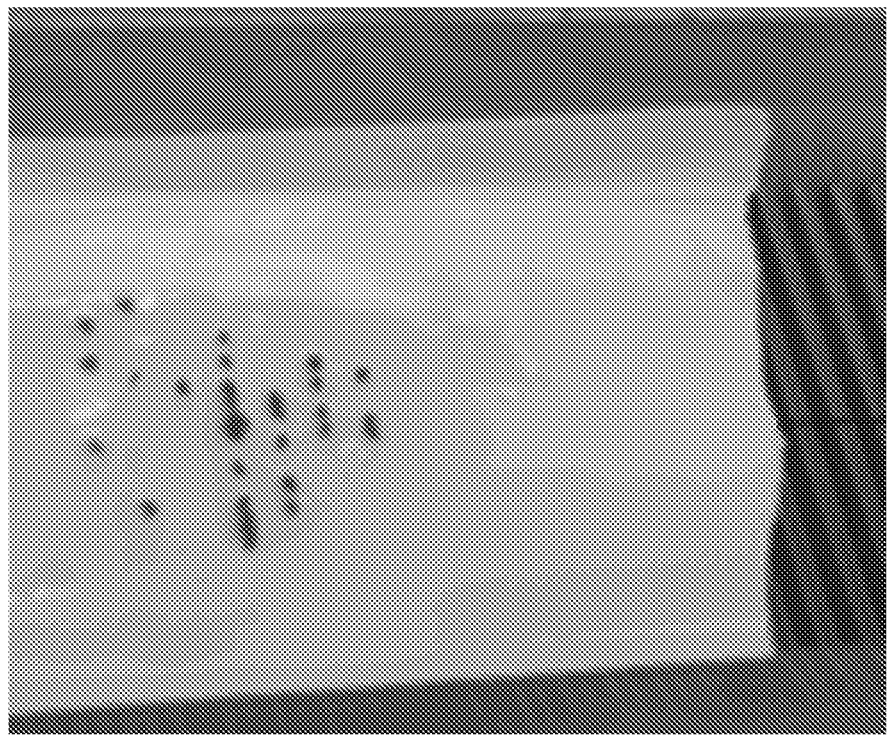
FIG. 21 is a digital image of magnetizable abrasive particles in an epoxy coating after the backing, the tooling and the magnetizable abrasive articles were vibrated in accordance with Example 5.

In the second experiment, the whole setup was mounted on the stand of an F-TO Syntron Magnetic Feeder such that the shims of the tooling were in the vibration direction. Another piece of the phenolic coated tape was adhered onto the shimmed tool and magnetic-coated MAP1 were deposited on the tape surface while the Feeder stand was vibrating the whole set up at a 32% amplitude. Upon reaching to the epoxy coating, the SAP particles not only began aligning themselves in the same direction of the ferrous shims, but they also had a tendency to space themselves out and not bunch up on each other as shown in FIG. 21.

The above EXAMPLES provide a major benefit over existing placement processes where tooling is positioned above the resin coated surface but a very precise gap must be maintained to prevent this tooling from making contact with the resin coated web. The above described EXAMPLES and embodiments provide a way in which tooling can be spaced from the resin coated web to reduce or eliminate the risk of contaminating the tooling with resin but a precise alignment and/or orientation of the MAP1 particles can still be achieved.

Example 6

Figure 22:
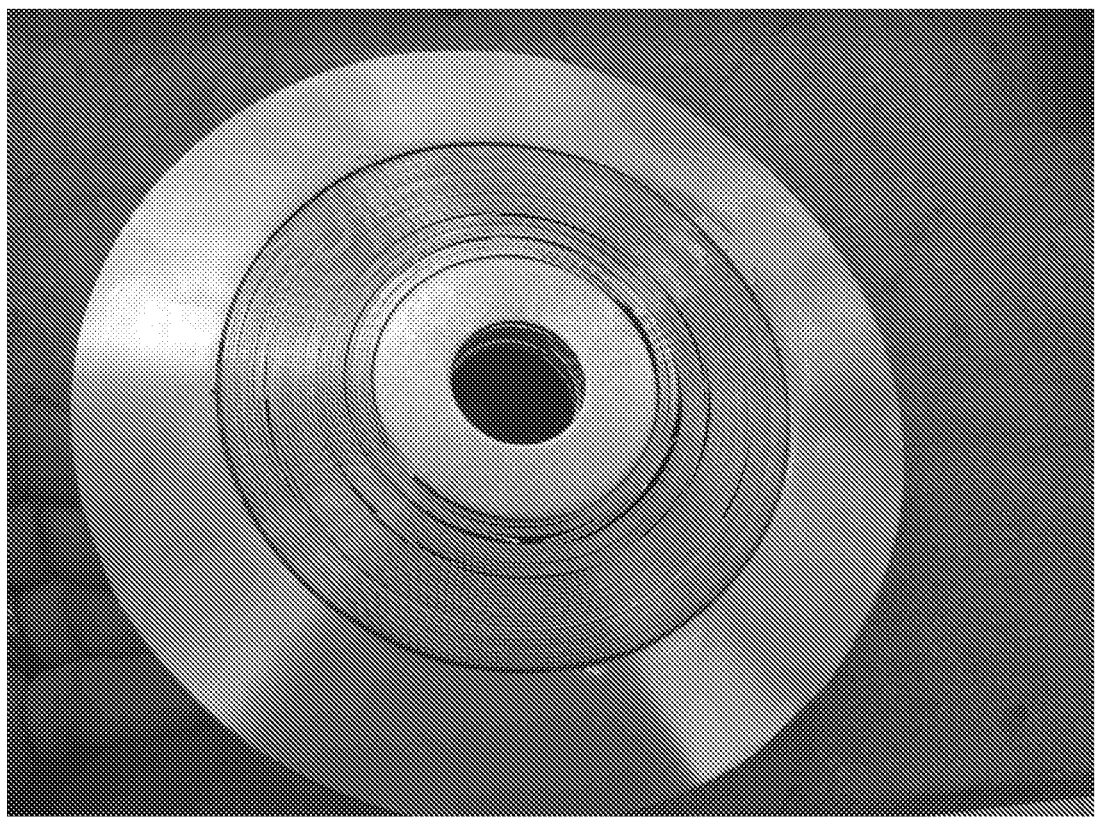
FIG. 22 is a digital image of an apparatus comprised of a first portion with magnetizable material and a second portion with non-magnetizable material in accordance with Example 6.

A mold for depressed center grinding wheels was modified so that the bottom plate of the mold was composed of spiral wrapped shim stock. The spiral was composed of 10 mil carbon steel and 20 mil brass. The shims were wrapped around an aluminum center core that was 0.5" thick, 2" diameter and had a center hole of 1". The spiral wrap was continued until the outer diameter of the assembly measured 4.5". This "plate" was placed into a stainless steel 4.5" diameter by 2" deep mold cavity used for depressed center grinding wheels. Then, the mold assembly was placed on top of an 8" diameter by 2" thick N52 Neodymium magnet. A vinyl tape release liner was adhered to the top of the spiral and sidewalls to enable the wheel to release easier after pressing. FIG. 22 shows the mold. The spiral wrapped portion is flush with a top of the mold. A related embodiment is also described in reference to FIGS. 8-9B.

Figure 23A:
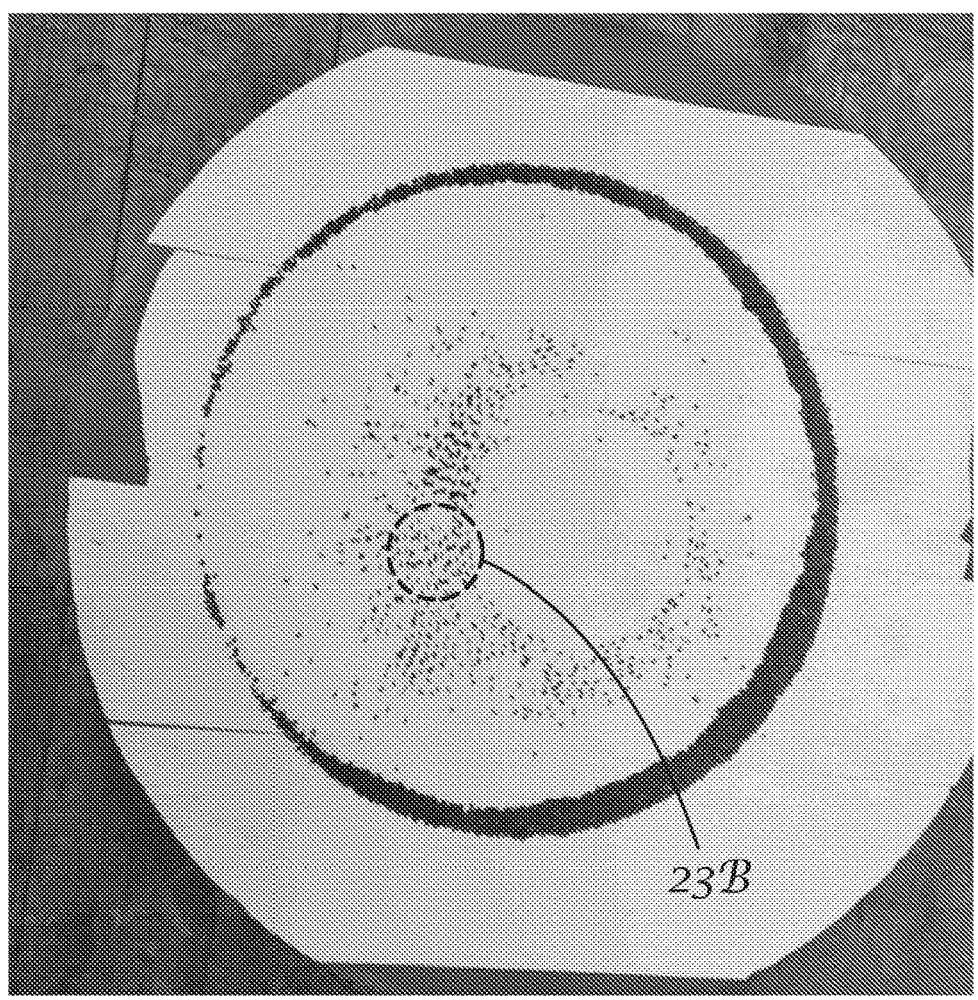
FIG. 23A is a digital image of magnetizable abrasive particles disposed upon a backing above an apparatus, the magnetizable abrasive particles having been oriented, aligned and positioned by a focused magnetic field in the region adjacent the first portion in accordance with Example 6.
Figure 23B:
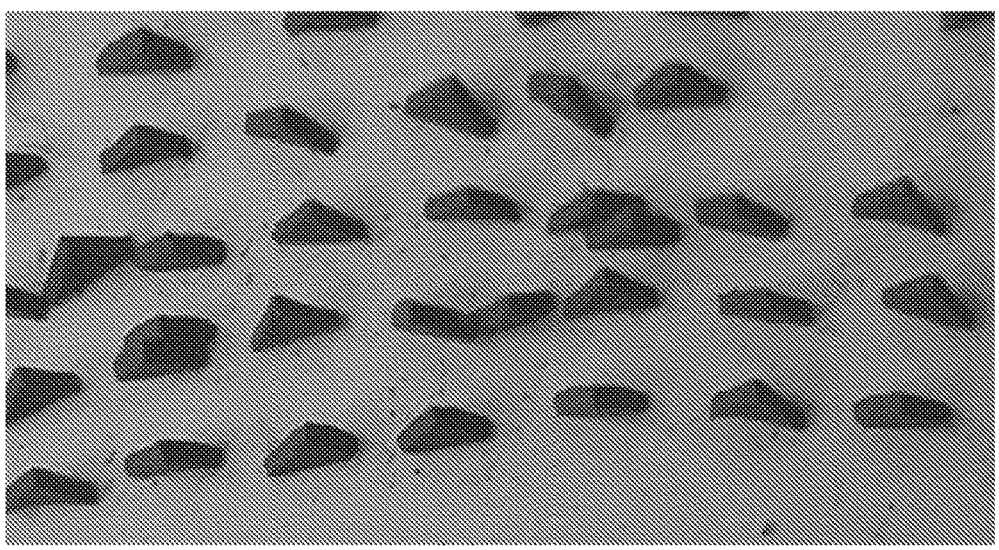
FIG. 23B is an enlargement of the digital image of 23A showing the alignment and orientation of the magnetizable abrasive particles.

A bond resin mix composed of SAP particles with a magnetizable coating with grade 36+ vapor coated precision shaped grain as described in U.S. Provisional Patent Application Ser. No. 62/412,411 was poured into the inside of the mold assembly as the first abrasive layer. Due to the focused magnetic field on the carbon steel shims, the first layer of particles followed the spiral pattern as shown in FIGS. 23A and 23B. Additionally, the particles were aligned in the direction following the spiral as shown in FIGS. 23A and 23B. As the rest of the bond resin was filled into the mold, it filled the voids between the spirals. After this step, the bond resin was rotary levelled and a fiber glass scrim was added on top. Then the crushed grain layer was added and rotary leveled. Next, the scrim, label, and bushing were added on top. After this step, a stainless steel top plate was added and the wheel was pressed at 30 tons and removed from the mold. Then, the wheel was put through a forming step to create the depressed center Type 27 shape. This was pressed at 8 tons. The wheel was then put through the standard production thermal curing cycle as described in U.S. Provisional Patent Application Ser. No. 62/412,411.

The invention claimed is:

1. A method of making an abrasive article, the method comprising:
    providing a tool that has a first portion that comprises a first material and a second portion that comprises a second material, wherein the second material differs from the first material, wherein the tool is disposed adjacent a magnet and the magnet subjects the tool to a magnetic field, and wherein the first material and the second material are provided such that the magnetic field is relatively stronger at and adjacent the first portion relative to the magnetic field at and adjacent the second portion;
    positioning a surface of an abrasive article backing adjacent to the tool so as to be subject to the magnetic field, wherein the surface of the abrasive article backing is coated with a first curable binder; and
    disposing magnetizable abrasive particles on the surface, wherein the magnetizable abrasive particles are attracted to an area on the surface adjacent the first portion where the magnetic field is relatively stronger so as to dispose each of the attracted magnetizable particles on the surface adhered to the first curable binder to provide for at least one of a desired orientation, placement and alignment of a majority of the magnetizable abrasive particles on the surface of the abrasive article backing.

2. The method of claim 1, wherein the first material comprises a magnetizable material and the second material comprises a non-magnetizable material.

3. The method of claim 1, wherein the first material comprises a magnet and the second material comprises a non-magnetizable material.

4. The method of claim 1, further comprising vibrating one or more of the surface, the magnetizable abrasive particles and the tool to enhance at least one of the alignment and the orientation of the magnetizable abrasive particles on the abrasive article backing.

5. The method of claim 1, wherein one of the surface and the tool is translated relative to the other of the surface and the tool, and the method is part of a continuous process.

6. The method of claim 1, wherein the method is part of a batch process.

7. The method of claim 1, wherein the abrasive article comprises a coated article and the surface comprises a first major surface of the abrasive article backing, the method further comprising:
providing the first curable binder disposed on at least a portion of the first major surface;
orienting the backing such that the second major surface is closer to the tool than the first major surface;
at least partially curing the first curable binder to provide an at least partially cured abrasive layer secured to the abrasive article backing.

8. The method of claim 7, further comprising:
disposing a layer of a second curable binder precursor onto at least a portion of the at least partially cured abrasive layer, and at least partially curing the second curable binder precursor.

9. The method of claim 1, wherein the tool comprises at least one of a permanent magnet and an electromagnet at the first portion or a magnetizable material at the first portion and the second portion comprises a non-magnetizable material, and wherein the first portion and the second portion are arranged in a predetermined pattern.

10. The method of claim 9, wherein the predetermined pattern is discontinuous in at least one of a cross-web and a down-web direction on the surface.

11. The method of claim 9, wherein the predetermined pattern is discontinuous such that the first portion comprises a plurality of regions that are spaced apart from one another by the second portion.

12. The method of claim 1, wherein the surface comprises a backing and a first major surface of the backing has ridges and grooves therein, and wherein a majority of the magnetizable abrasive particles are partially disposed within and aligned with the grooves between the ridges.

13. A method of making a bonded abrasive wheel, the method comprising:
providing a tool that has a first portion that comprises a first material and a second portion that comprises a second material, wherein the second material differs from the first material, wherein the tool is disposed adjacent a magnet and the magnet subjects the tool to a magnetic field, and wherein the first material and the second material are provided such that the magnetic field is relatively stronger at and adjacent the first portion relative to the magnetic field at and adjacent the second portion;
positioning a surface of a mold having a circular cavity adjacent to the tool so as to be subject to the magnetic field; and
disposing a layer of a first curable composition into a circular cavity of a mold, wherein the mold has an outer circumference and a rotational axis extending therethrough, and wherein the curable composition comprises the magnetizable abrasive particles dispersed in a first organic binder precursor, wherein the magnetizable abrasive particles are attracted to an area on the surface adjacent the first portion where the magnetic field is relatively stronger so as to dispose each of the attracted magnetizable particles on the surface to provide for at least one of a desired orientation, placement and alignment of a majority of the magnetizable abrasive particles on the surface of the mold;
disposing a first porous reinforcing material onto the layer of first curable composition;
disposing a layer of a second curable composition onto the porous reinforcing material and first curable composition, wherein the second curable composition comprises the magnetizable abrasive particles dispersed in a second organic binder precursor;
wherein the applying of the magnetic field to the first and second curable compositions orients a majority of the magnetizable abrasive particles relative to the rotational axis; and
at least partially curing the curable composition to provide the bonded abrasive wheel.

14. The method of claim 13, wherein sequent to disposing the layer of the first curable composition a second porous reinforcing material is placed in the circular mold cavity, and wherein the layer of the first curable composition is disposed on the second reinforcing material.

* * * * *